(12) United States Patent
Ozawa et al.

(10) Patent No.: US 7,927,949 B2
(45) Date of Patent: Apr. 19, 2011

(54) SEMICONDUCTOR MEMORY DEVICE AND METHOD OF MANUFACTURING THE SAME

(75) Inventors: Yoshio Ozawa, Yokohama (JP); Isao Kamioka, Machida (JP); Junichi Shiozawa, Yokkaichi (JP); Akihito Yamamoto, Naka-gun (JP); Ryota Fujitsuka, Yokohama (JP); Yoshihiro Ogawa, Yokohama (JP); Katsuaki Natori, Yokohama (JP); Katsuyuki Sekine, Yokohama (JP); Masayuki Tanaka, Yokohama (JP); Daisuke Nishida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/755,532

(22) Filed: Apr. 7, 2010

(65) Prior Publication Data

US 2010/0197130 A1 Aug. 5, 2010

Related U.S. Application Data

(60) Division of application No. 11/699,502, filed on Jan. 30, 2007, now Pat. No. 7,723,772, which is a continuation-in-part of application No. 11/190,120, filed on Jul. 27, 2005, now abandoned.

(30) Foreign Application Priority Data

Apr. 26, 2005 (JP) ................. 2005-128232

(51) Int. Cl.
*H01L 21/336* (2006.01)
*H01L 21/8238* (2006.01)
*H01L 21/3205* (2006.01)
*H01L 21/4763* (2006.01)

(52) U.S. Cl. ......... 438/257; 438/594; 438/261; 438/211
(58) Field of Classification Search ................. 438/257, 438/305, 756, 757, 201, 207, 294, 211, 221, 438/261, 296, 359, 775, 792, 266, 264, 263, 438/594, 275
See application file for complete search history.

(56) References Cited

U.S. PATENT DOCUMENTS

| | | | |
|---|---|---|---|
| 6,069,041 A | 5/2000 | Tanigami et al. | |
| 6,551,948 B2 | 4/2003 | Ohmi et al. | |
| 2004/0119111 A1* | 6/2004 | Omi et al. | 257/315 |
| 2005/0045966 A1 | 3/2005 | Yamashita et al. | |
| 2005/0157549 A1* | 7/2005 | Mokhlesi et al. | 365/185.01 |
| 2007/0196985 A1 | 8/2007 | Ozawa et al. | |

(Continued)

FOREIGN PATENT DOCUMENTS

JP 03-220778 9/1991

(Continued)

OTHER PUBLICATIONS

Chinese Office Action from Chinese Patent Application No. 2005101329708 dated Feb. 29, 2008.

(Continued)

*Primary Examiner* — Chuong A. Luu
(74) *Attorney, Agent, or Firm* — Finnegan, Henderson, Farabow, Garrett & Dunner, L.L.P.

(57) ABSTRACT

A semiconductor memory device manufacturing method includes forming a floating gate electrode above a semiconductor substrate, forming an interelectrode insulating film above the floating gate electrode, forming a first radical nitride film on a surface of the interelectrode insulating film by first radical nitriding, and forming a control gate electrode on the first radical nitride film.

6 Claims, 17 Drawing Sheets

U.S. PATENT DOCUMENTS

| | | |
|---|---|---|
| 2009/0039406 A1 | 2/2009 | Kitagawa et al. |
| 2010/0197130 A1* | 8/2010 | Ozawa et al. ................ 438/594 |

FOREIGN PATENT DOCUMENTS

| | | |
|---|---|---|
| JP | 7-249697 | 9/1995 |
| JP | 8-153814 | 6/1996 |
| JP | 9-219459 | 8/1997 |
| JP | 11-026728 | 1/1999 |
| JP | 2000-174149 | 6/2000 |
| JP | 2002-261091 | 9/2002 |
| JP | 2004-193413 | 7/2004 |
| JP | 2005-085996 | 3/2005 |
| WO | WO 01/69673 A1 | 9/2001 |
| WO | WO 2004/053992 A2 | 6/2004 |
| WO | WO 2006/112388 A1 | 10/2006 |

OTHER PUBLICATIONS

"Notice of Reasons for Rejection" mailed Aug. 24, 2010, from the Japanese Patent Office in corresponding JP Application No. 2005-128232, and English language translation thereof.

* cited by examiner

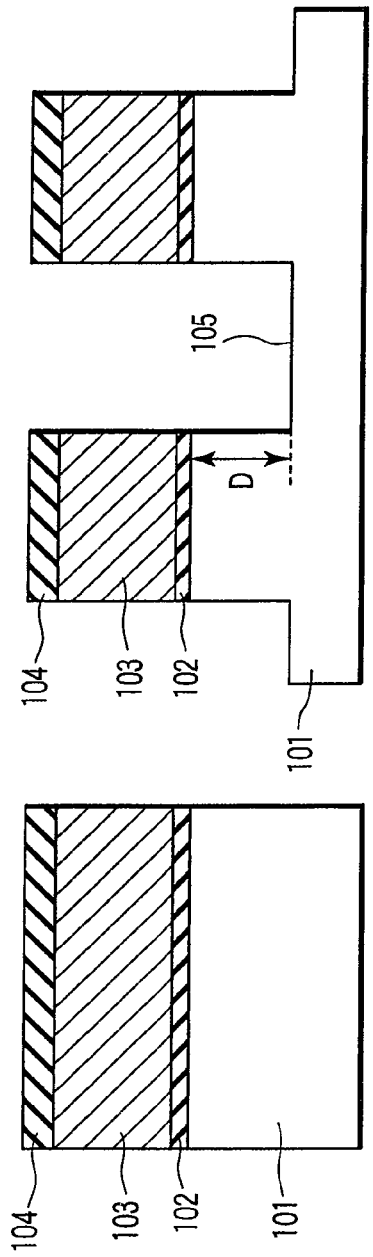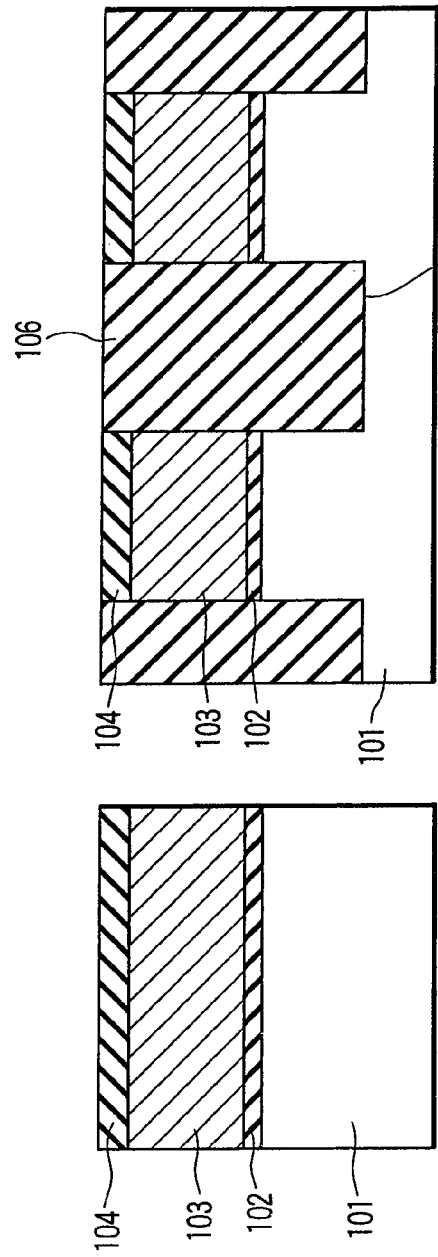
FIG. 2A  FIG. 2B  FIG. 3A  FIG. 3B

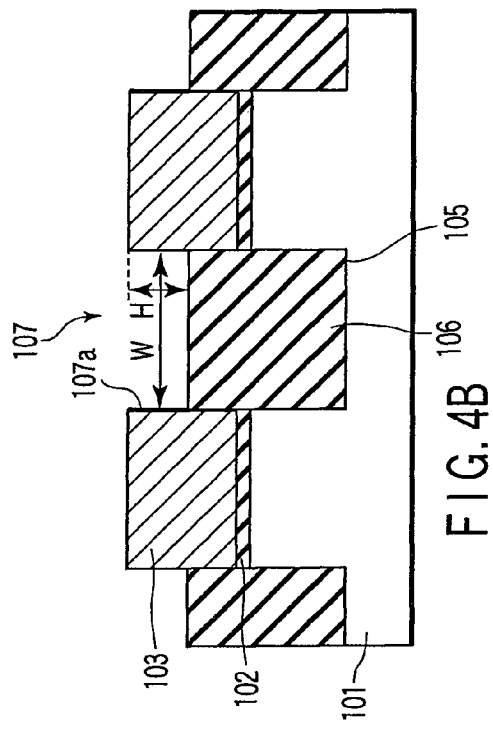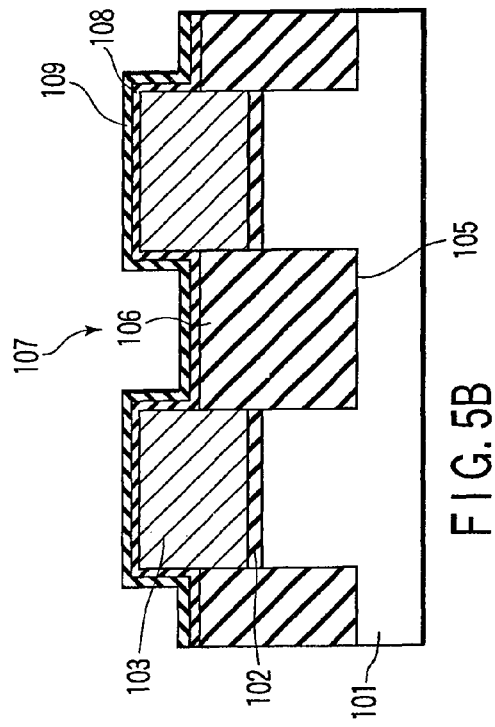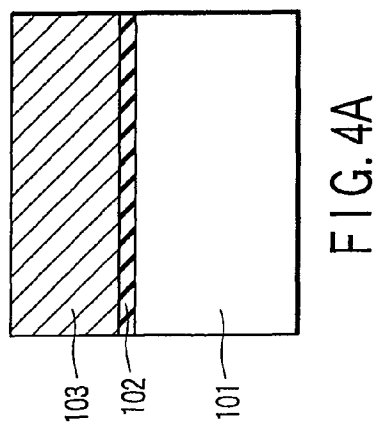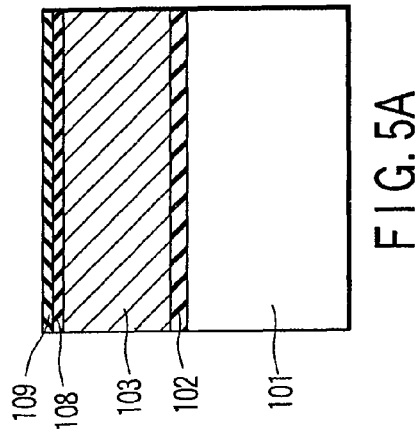

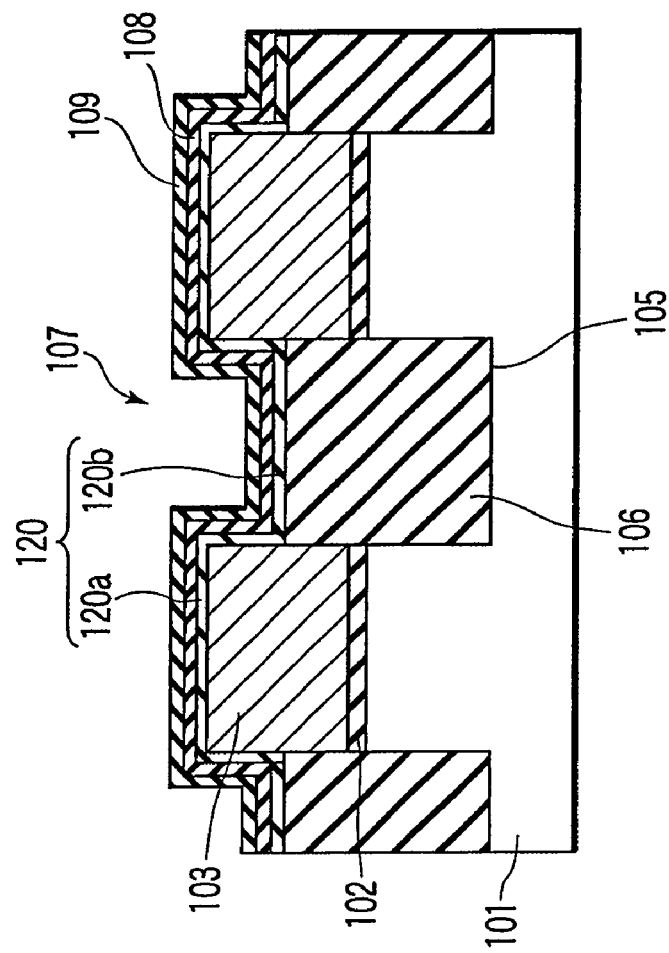
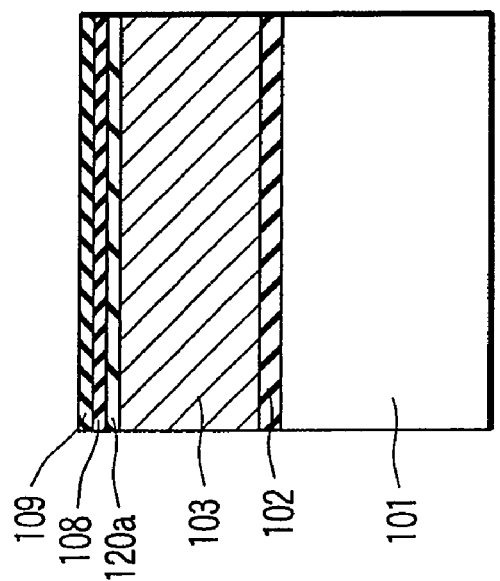

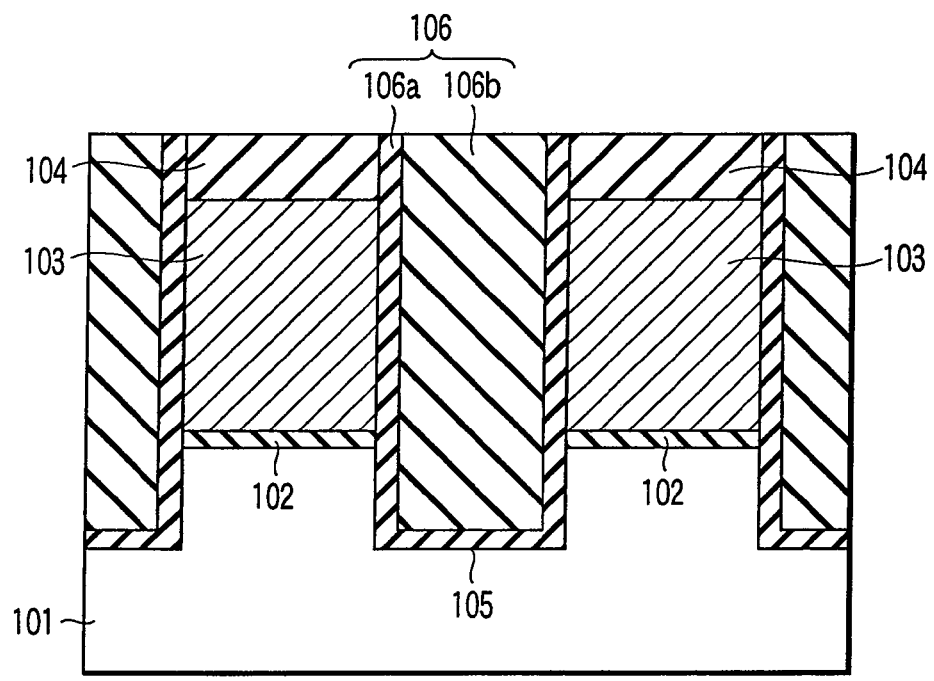
F I G. 15
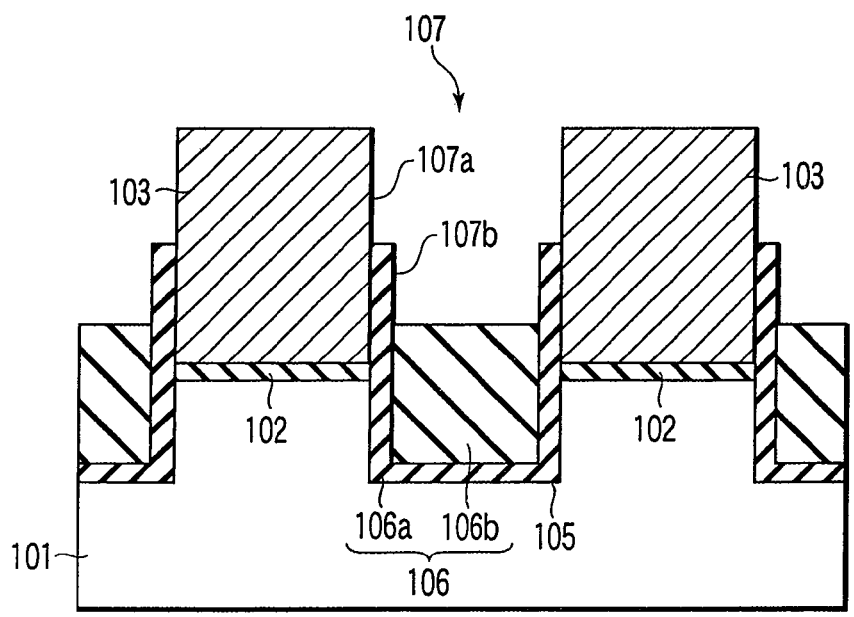
F I G. 16

SEMICONDUCTOR MEMORY DEVICE AND METHOD OF MANUFACTURING THE SAME

CROSS-REFERENCE TO RELATED APPLICATIONS

This is a divisional of application Ser. No. 11/699,502, filed Jan. 30, 2007 now U.S. Pat. No. 7,723,772, which is a Continuation-in-Part application of application Ser. No. 11/190,120, filed Jul. 27, 2005, now abandoned, the entire contents of both of which are incorporated herein by reference.

This application is based upon and claims the benefit of priority from prior Japanese Patent Application No. 2005-128232, filed Apr. 26, 2005, the entire contents of which are incorporated herein by reference.

BACKGROUND OF THE INVENTION

1. Field of the Invention

The present invention relates to a semiconductor memory device including a floating gate electrode and control gate electrode, and a method of manufacturing the same.

2. Description of the Related Art

Conventionally, a nonvolatile semiconductor memory device including a floating gate electrode FG and control gate electrode CG has been proposed as a semiconductor memory.

In this nonvolatile semiconductor memory device, as shown in FIG. 23, a floating gate electrode FG, interelectrode insulating film 208, and control gate electrode CG are processed into a desired shape, and a gate sidewall oxide film 212 is formed on the entire surface by oxidation after that. When the gate sidewall oxide film 212 is formed, however, thick so-called "bird's beak" oxidation regions 213 are formed in the upper and lower end portions of the interelectrode insulating film 208. This decreases the electric capacitance of the interelectrode insulating film 208, and causes faulty operations of the memory device. These problems caused by the formation of the bird's beak oxidation regions 213 similarly arise when a high-k oxide film such as a hafnium oxide film, zirconium oxide film, or tantalum oxide film, or an insulating film obtained by adding an impurity to a high-k oxide film like this is used as the interelectrode insulating film 208.

As a method of avoiding the formation of the bird's beaks described above, a technique as shown in FIGS. 24A and 24B is disclosed (e.g., Jpn. Pat. Appln. KOKAI Publication No. 7-249697, 8-153814, or 9-219459). In this technique, silicon nitride layers 231 and 232 are formed in the upper and lower interfaces of an interelectrode insulating film 208, thereby preventing the penetration of an oxidation species during gate sidewall oxidation and preventing the formation of bird's beaks.

This technique discloses CVD (Chemical Vapor Deposition) or thermal nitriding as the method of forming the silicon nitride layers 231 and 232. However, the following problems arise if the silicon nitride layers 231 and 232 are formed by using CVD or thermal nitriding.

When CVD is used, the total physical film thickness of an interelectrode insulating film 208a between a control gate electrode CG and floating gate electrode FG increases. Therefore, as shown in FIG. 24B, the depth P of the control gate electrode CG buried between adjacent cells decreases. This decreases the capacitance of the interelectrode insulating film 208 and increases the parasitic capacitance between the adjacent cells, so the memory device suffers faulty operation. In addition, the width Q of the control gate electrode CG buried between the adjacent cells decreases. Since this depletes the buried portion of the control gate electrode CG, the memory device suffers faulty operation. Furthermore, if the depth P is well increased, the distance R between a substrate 201 and the interelectrode insulating film 208 shortens. This decreases the breakdown voltage between the substrate 201 and control gate electrode CG, so the memory device suffers faulty operation. These problems are significant when the depth P, width Q, and distance R are approximately 100 nm or less.

On the other hand, when thermal nitriding is used, a high-temperature, long-time thermal budget is necessary to form silicon nitride layers 231 and 232 having a thickness which prevents the formation of bird's beaks. Since this degrades the quality of a tunnel oxide film 202, the reliability of the memory device is also degraded.

BRIEF SUMMARY OF THE INVENTION

A semiconductor memory device according to a first aspect of the present invention comprises a semiconductor substrate, a tunnel insulating film formed on the semiconductor substrate, a floating gate electrode formed on the tunnel insulating film, and having a first side-surface portion positioned in an upper portion and a second side-surface portion positioned below the first side-surface portion, an element isolation trench formed in the semiconductor substrate to be adjacent to the floating gate electrode, a first element isolation insulating film formed along a side surface and bottom surface of the element isolation trench from the second side-surface portion of the floating gate electrode, a second element isolation insulating film formed on the first element isolation insulating film to expose a side-surface portion in an upper portion of the first element isolation insulating film, a first radical nitride film formed on the floating gate electrode and first and second element isolation insulating films, an interelectrode insulating film formed on the first radical nitride film, a nitrogen-containing film formed on the interelectrode insulating film, and a control gate electrode formed on the nitrogen-containing film, wherein in the second side-surface portion of the floating gate electrode, a portion of the first element isolation insulating film exists between the floating gate electrode and first radical nitride film.

A semiconductor memory device manufacturing method according to a second aspect of the present invention comprises forming a floating gate electrode above a semiconductor substrate, forming an interelectrode insulating film above the floating gate electrode, forming a first radical nitride film on a surface of the interelectrode insulating film by first radical nitriding, and forming a control gate electrode on the first radical nitride film.

BRIEF DESCRIPTION OF THE SEVERAL VIEWS OF THE DRAWING

FIGS. 2A, 2B, 3A, 3B, 4A, 4B, 5A, 5B, 6A, 6B, 7A and 7B are sectional views in the bit line direction and word line direction, respectively, showing the manufacturing steps of the nonvolatile semiconductor memory device according to the first embodiment of the present invention;

FIGS. 9A, 9B, 10A, 10B, 11A, 11B, 12A and 12B are sectional views in the bit line direction and word line direction, respectively, showing the manufacturing steps of the nonvolatile semiconductor memory device according to the second embodiment of the present invention;

FIGS. 15, 16 and 17 are sectional views showing the manufacturing steps of the nonvolatile semiconductor memory device of means example 1 according to the third embodiment of the present invention;

DETAILED DESCRIPTION OF THE INVENTION

Figure 1B:
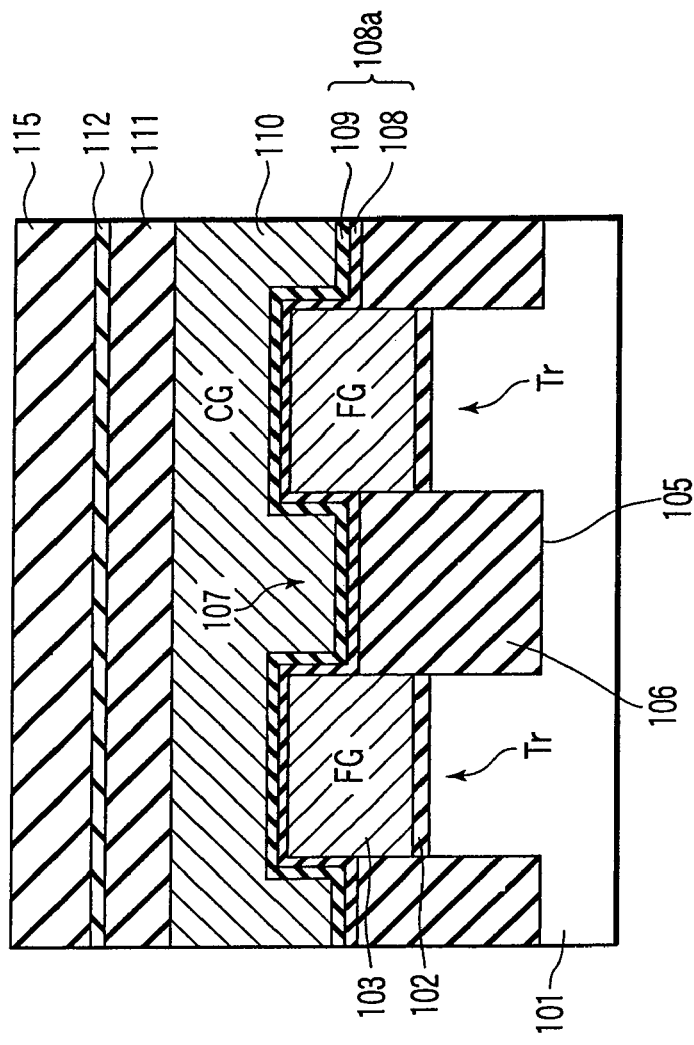
FIGS. 1A and 1B are sectional views in the bit line direction and word line direction, respectively, showing a nonvolatile semiconductor memory device according to a first embodiment of the present invention.

Embodiments of the present invention will be described below with reference to the accompanying drawing. In the following explanation, the same reference numerals denote the same parts throughout the drawing.

First Embodiment

In a first embodiment, a radical nitride film is formed by radical nitriding on an interelectrode insulating film between a floating gate electrode and control gate electrode.

Figure 1A:
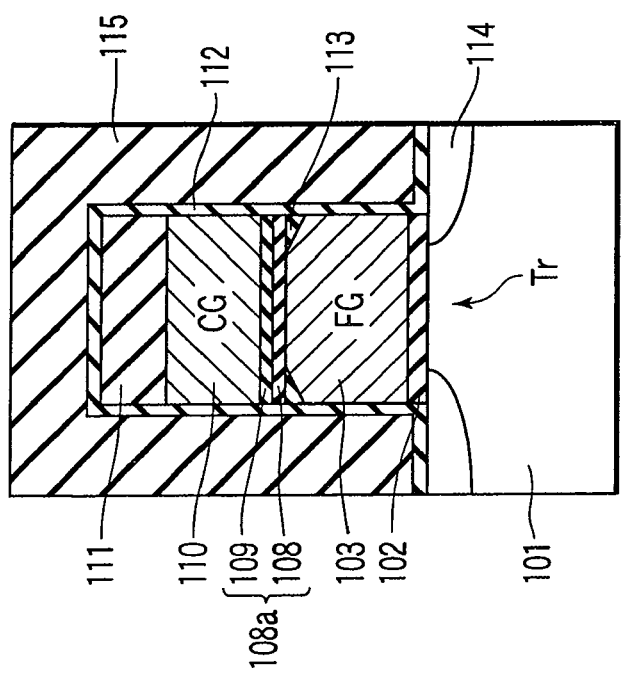

FIGS. 1A and 1B are sectional views of a nonvolatile semiconductor memory device according to the first embodiment of the present invention. FIG. 1A is a sectional view in the bit line direction (channel length direction), and FIG. 1B is a sectional view in the word line direction (channel width direction). This nonvolatile semiconductor memory device according to the first embodiment will be explained below.

As shown in FIGS. 1A and 1B, floating gate electrodes FG are formed on a silicon substrate 101 via a tunnel oxide film 102, and an interelectrode insulating film 108 is formed on the floating gate electrodes FG. A radical nitride film 109 is formed on the interelectrode insulating film 108 by radical nitriding. A control gate electrode CG is formed on the radical nitride film 109, and a mask material 111 is formed on the control gate electrode CG. A gate sidewall oxide film 112 is formed on the side surfaces of the mask material 111, control gate electrode CG, radical nitride film 109, interelectrode insulating film 108, floating gate electrodes FG, and tunnel oxide film 102. An interlayer dielectric film 115 is formed on the gate sidewall oxide film 112. Source/drain diffusion layers 114 are formed in the silicon substrate 101 to form memory cell transistors Tr.

As described above, the radical nitride film 109 is formed on the interelectrode insulating film 108. Therefore, when oxidation is performed to form the gate sidewall oxide film 112 or the interlayer dielectric film 115, the radical nitride film 109 prevents the penetration of an oxidation species to the lower surface of the control gate electrode CG through the interelectrode insulating film 108, so no bird's beak oxidation region exists on the interelectrode insulating film 108. However, bird's beak oxidation regions 113 exist below the two ends of the interelectrode insulating film 108. The bird's beak oxidation regions 113 are thick regions formed when portions of the interelectrode insulating film 108 are oxidized by the oxidation described above.

Note that the interelectrode insulating film 108 is desirably a silicon oxide film, a metal silicate film, a stacked film having a silicon oxide film as an upper layer, or a stacked film having a metal silicate film as an upper layer. Examples of the metal of the metal silicate film are aluminum (Al), zirconium (Zr), lanthanum (La), hafnium (Hf), and tantalum (Ta). In this embodiment, the interelectrode insulating film 108 is an ONO (Oxide/Nitride/Oxide) film as an example.

The radical nitride film 109 is a nitrogen-containing film formed by performing radical nitriding on the surface of the interelectrode insulating film 108. Therefore, the radical nitride film 109 is, e.g., a silicon oxynitride film or silicon nitride film in accordance with the material of the interelectrode insulating film 108 as an undercoat. In this embodiment, the radical nitride film 109 is a silicon oxynitride film as an example.

FIGS. 2A and 2B to FIGS. 7A and 7B are sectional views of the manufacturing steps of the nonvolatile semiconductor memory device according to the first embodiment of the present invention. Each figure with a suffix A is a sectional view in the bit line direction (channel length direction), and each figure with a suffix B is a sectional view in the word line direction (channel width direction). A method of manufacturing the nonvolatile semiconductor memory device according to the first embodiment will be explained below.

First, as shown in FIGS. 2A and 2B, a tunnel oxide film 102 having a thickness of, e.g., 10 nm is formed by thermal oxidation on the surface of a silicon substrate 101 in which a desired impurity is doped. Then, CVD (Chemical Vapor Deposition) is used to sequentially deposit a phosphorus-doped polysilicon layer 103 having a thickness of, e.g., 100 nm and serving as floating gate electrodes FG, and a mask material (e.g., a silicon nitride film) 104 for element isolation processing. After that, the mask material 104, polysilicon layer 103, and tunnel oxide film 102 are sequentially etched by RIE (Reactive Ion Etching) using a resist mask (not shown). In addition, an exposed region of the silicon substrate 101 is etched to form an element isolation trench 105 having a depth D of, e.g., 100 nm in the silicon substrate 101.

As shown in FIGS. 3A and 3B, an element isolation insulating film 106 made of, e.g., a silicon oxide film is deposited in the element isolation trench 105 and on the mask material 104, and the element isolation trench 105 is completely filled with the element isolation insulating film 106. After that, the upper surface of the element isolation insulating film 106 is planarized by CMP (Chemical Mechanical Polish) until the mask material is exposed.

As shown in FIGS. 4A and 4B, the exposed mask material 104 is selectively etched away. Then, the element isolation insulating film 106 is partially etched away by using a dilute hydrofluoric acid solution until the upper surface of the element isolation insulating film 106 is positioned below the upper surface of the polysilicon layer 103. Consequently, a trench 107 is formed between the polysilicon layers 103 (floating gate electrodes FG) adjacent to each other, and sidewall surfaces 107a of the polysilicon layers 103 are exposed. A height H of the sidewall surfaces 107a is, e.g., 50 nm. Also, an interval (the width of the element isolation insulating film 106) W of the adjacent polysilicon layers 103 (floating gate electrodes FG) is, e.g., 50 nm.

As shown in FIGS. 5A and 5B, an interelectrode insulating film 108 is formed in the trench 107 and on the polysilicon layers 103. The interelectrode insulating film 108 is an ONO film having a thickness of, e.g., 15 nm. This ONO film is made up of three films, i.e., a silicon oxide film/silicon nitride film/silicon oxide film each having a thickness of, e.g., 5 nm.

Then, the silicon substrate 101 is placed in a radical nitriding chamber (not shown) and heated to 400° C., the pressure is adjusted to 6 Pa while a gas mixture of 40 sccm of nitrogen ($N_2$) gas and 1,000 sccm of argon (Ar) gas is supplied into the chamber, and microwaves having a power of 1 kW are supplied to generate radical nitrogen, thereby performing radical nitriding on the surface of the interelectrode insulating film 108 for 90 sec. As a consequence, a radical nitride film 109 is formed on the surface of the interelectrode insulating film 108. The radical nitride film 109 is formed because the radical nitrogen diffuses in the surface portion of the interelectrode insulating film 108. In this embodiment, a silicon oxynitride film having a thickness of, e.g., 2 nm is formed as the radical nitride film 109 in the surface portion of the silicon oxide film in the upper portion of the ONO film as the interelectrode insulating film 108.

Radical nitrogen means a nitrogen atom in an excited state, a nitrogen atom in a ground state, and a nitrogen molecule in an excited state, and includes both electrically neutral and charged atoms or molecules. The above effect is obtained when one or more types of the radical nitrogen are contained. Radical nitriding is also a nitriding method which uses one or more types of the radical nitrogen described above as nitriding species. A typical radical nitrogen density is $1E12$ $cm^{-3}$ or more. To shorten the process time of the nitriding step by increasing the nitriding efficiency, a radical nitrogen density of $1E15$ $cm^{-3}$ or more is desired.

In this embodiment, radical nitriding of the surface of the interelectrode insulating film 108 is performed in the gas mixture ambient containing nitrogen gas and argon gas. However, the radical nitriding method is not limited to this method, and it is also possible to use another nitrogen-containing gas or a gas mixture of another nitrogen-containing gas and a rare gas. However, to prevent an element, such as hydrogen or chlorine, other than nitrogen from mixing in the radical nitride film 109 and degrading the insulation properties, it is desirable to generate nitrogen radicals by using nitrogen gas alone or a gas mixture of nitrogen gas and a rare gas. Furthermore, a rare gas is preferably mixed in order to increase the radical nitrogen generation efficiency.

Also, in this embodiment, the radical nitride film 109 is formed by generating radical nitrogen by supplying microwaves into the reaction chamber in which the silicon substrate 101 is placed. However, the radical nitriding method is not limited to this method. That is, to alleviate deterioration of the tunnel oxide film 102 and interelectrode insulating film 108 caused by so-called plasma damage, the radical nitride film 109 may also be formed by transferring, to the reaction chamber, radical nitrogen generated in a chamber different from the reaction chamber. Also, to form a thicker radical nitride film 109, it is possible to directly place the silicon substrate 101 in a plasma containing radical nitrogen, or apply a bias to the silicon substrate 101 and draw excited nitrogen ions.

Figure 6B:
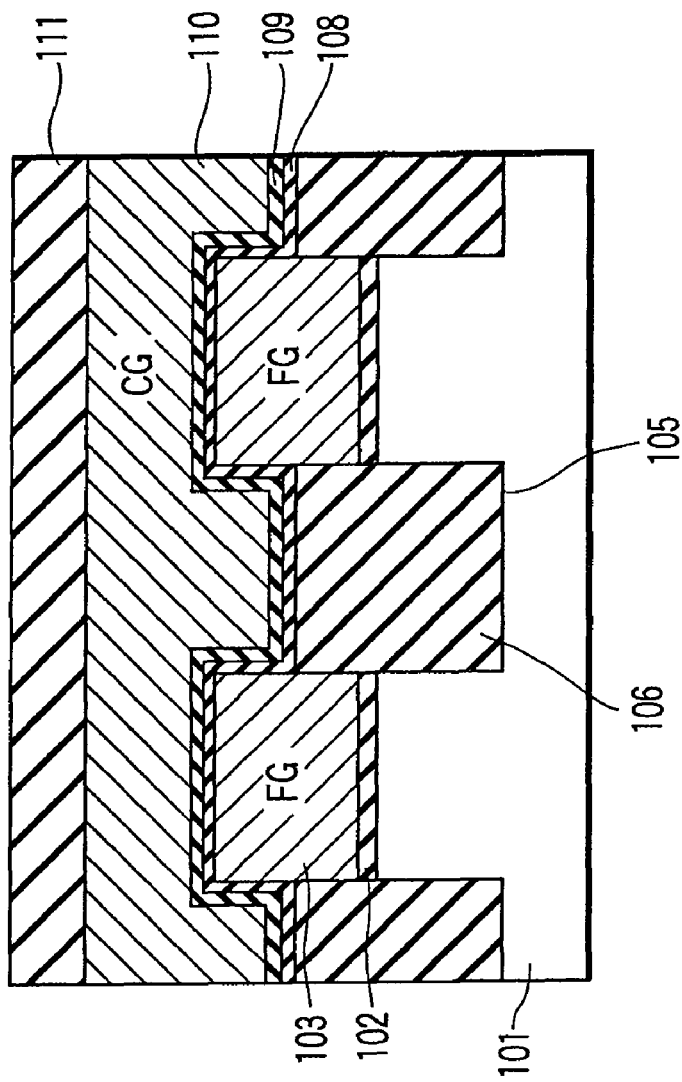
Figure 6A:
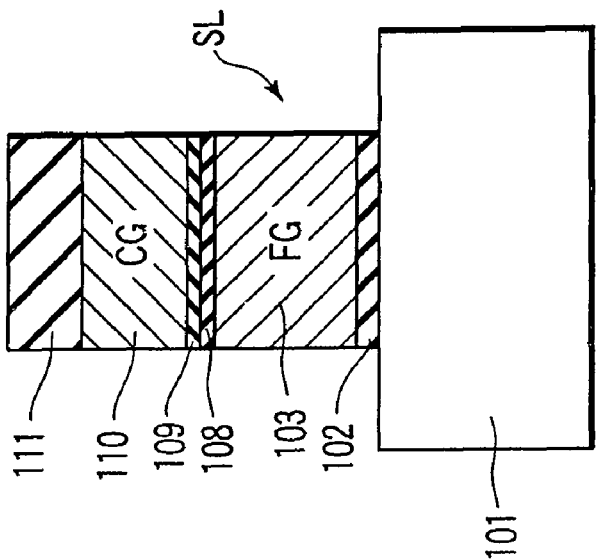

As shown in FIGS. 6A and 6B, a conductive layer 110 having a thickness of, e.g., 100 nm and serving as a control gate electrode CG is deposited on the radical nitride film 109 by CVD. The conductive layer 110 has a two-layered structure including, e.g., a polysilicon layer/tungsten silicide layer. In addition, an RIE mask material 111 is deposited on the conductive layer 110. After that, the mask material 111, conductive layer 110, radical nitride film 109, interelectrode insulating film 108, polysilicon layer 103, and tunnel oxide film 102 are sequentially etched by RIE using a resist mask (not shown). By this etching, slits SL are formed in the word line direction. In this manner, floating gate electrodes FG and a control gate electrode CG each having a desired shape are formed.

Figure 7B:
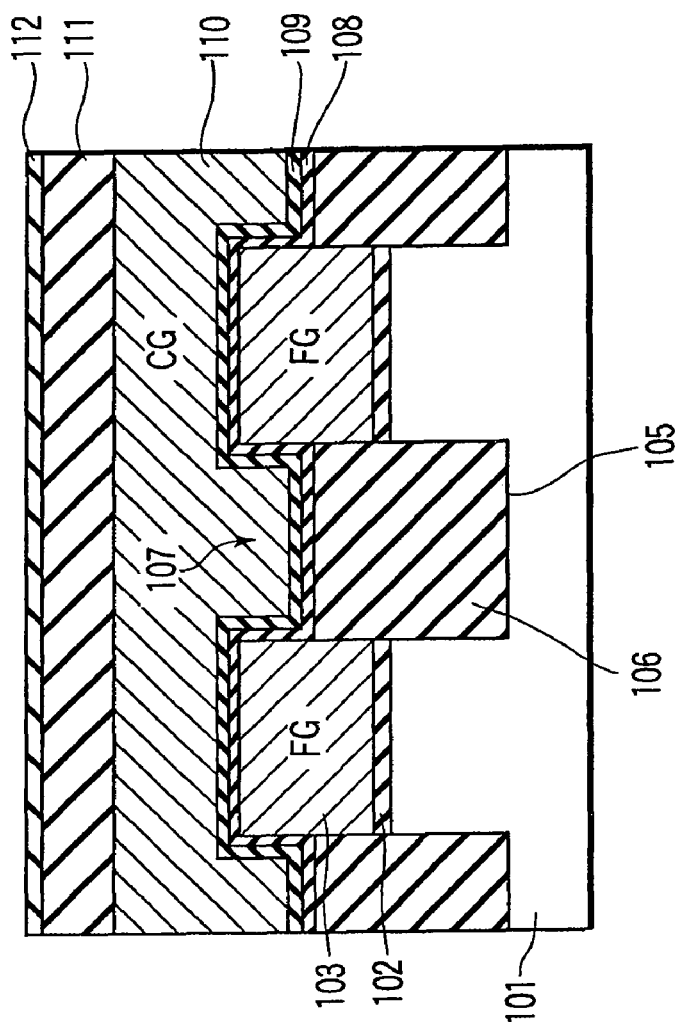
Figure 7A:
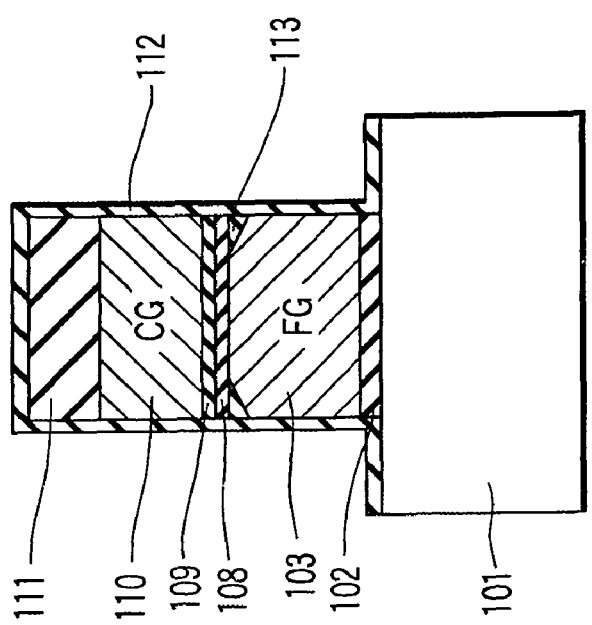

As shown in FIGS. 7A and 7B, thermal oxidation and CVD are combined to form a gate sidewall oxide film 112 made of, e.g., a silicon oxide film on the silicon substrate 101, on the side surfaces of the tunnel oxide film 102, floating gate electrodes FG, interelectrode insulating film 108, radical nitride film 109, control gate electrode CG, and mask material 111, and on the mask material 111. Bird's beak oxidation regions 113 are also formed below the end portions of the interelectrode insulating film 108.

Then, as shown in FIGS. 1A and 1B, ion implantation is used to form source/drain diffusion layers 114 in the silicon substrate 101. In addition, an interlayer dielectric film 115 made of, e.g., a TEOS film is formed on the gate sidewall oxide film 112. After that, a nonvolatile semiconductor memory device is completed by forming interconnecting layers and the like by using the well-known method.

In the first embodiment described above, the radical nitride film 109 is formed on the interelectrode insulating film 108 by radical nitriding. Since, therefore, the upper surface of the interelectrode insulating film 108 is protected by the radical nitride film 109 when the gate sidewall oxide film 112 and the interlayer dielectric film 115 are formed, no bird's beak oxidation region is formed on the upper surface of the interelectrode insulating film 108 even after the oxidation step. In addition, the radical nitride film 109 is formed when radical nitrogen diffuses into the surface portion of the interelectrode insulating film 108, so an increase in physical film thickness of the interelectrode insulating film 108 caused by the formation of the radical nitride film 109 is almost negligible. Instead, the physical film thickness slightly decreases in the embodiment case. From the foregoing, it is possible to suppress the formation of bird's beaks on the interelectrode insulating film 108 in the oxidation step of forming the gate sidewall oxide film 112 and the interlayer dielectric film 115, with almost no increase in total physical film thickness of the interelectrode insulating film 108a between the floating gate electrode FG and control gate electrode CG.

Also, as described above, the total physical film thickness of an interelectrode insulating film 108a hardly increases. This makes it possible to avoid malfunctions of the memory device caused by an increase in parasitic capacitance between adjacent cells, depletion of the control gate electrode CG, and a breakdown voltage drop between the silicon substrate 101 and control gate electrode CG. Note that if the interval (the width of the element isolation insulating film 106) W between the floating gate electrodes FG adjacent to each other is 100 nm or less, the effect of preventing the increase in physical film thickness of the interelectrode insulating film 108 becomes notable.

Furthermore, as described above, the radical nitride film 109 is formed by radical nitriding. Since this increases the dielectric constant of the surface portion (e.g., in the case of the ONO film, the surface portion of the upper silicon oxide film) forming the interelectrode insulating film 108, the electric capacitance of the interelectrode insulating film 108 also increases. An example of the effects is an increase in memory cell coupling ratio. In addition, when radical nitriding is performed by using a gas not containing hydrogen as in the above embodiment, insulation properties of the radical nitride film 109 improve, and an electric charge leak flowing through the interelectrode insulating film 108 is suppressed. An example of the effects is an improvement in memory cell charge retention characteristics. In addition, it is possible to avoid the thermal degradation of the tunnel oxide film by using low-temperature radical nitridation process.

Second Embodiment

In the first embodiment, the radical nitride film is formed only on the interelectrode insulating film. In a second embodiment, however, radical nitride films are formed above and below an interelectrode insulating film.

Figures 8A, 8B:
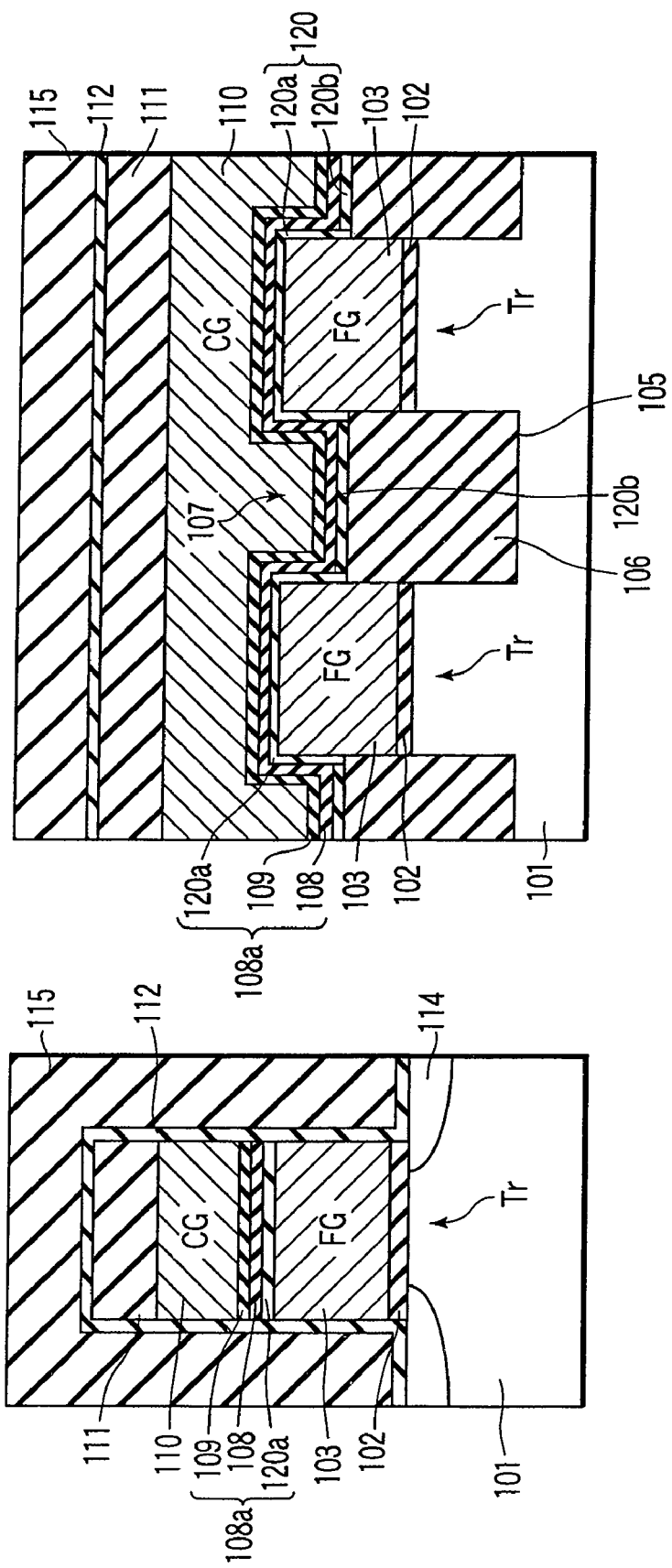
FIGS. 8A and 8B are sectional views in the bit line direction and word line direction, respectively, showing a nonvolatile semiconductor memory device according to a second embodiment of the present invention.

FIGS. 8A and 8B are sectional views of a nonvolatile semiconductor memory device according to the second embodiment of the present invention. FIG. 8A is a sectional view in the bit line direction (channel length direction), and FIG. 8B is a sectional view in the word line direction (channel width direction). This nonvolatile semiconductor memory device according to the second embodiment will be explained below.

As shown in FIGS. 8A and 8B, the second embodiment differs from the first embodiment in that a radical nitride film 109 is formed above an interelectrode insulating film 108, and a radical nitride film 120 is formed below the interelectrode insulating film 108. When oxidation is performed to form a gate sidewall oxide film 112, therefore, the upper surface of the floating gate electrode FG and lower surface of the control gate electrode CG are protected by the radical nitride films 120 and 109, respectively, so no bird's beak oxidation region is formed above and below the interelectrode insulating film 108.

As shown in FIG. 8B, the radical nitride film 120 below the interelectrode insulating film 108 is formed by performing radical nitriding on the exposed surfaces of floating gate electrodes FG and an element isolation insulating film 106. Therefore, in accordance with the material as an undercoat, a silicon nitride film 120a is formed on the floating gate electrodes FG made of, e.g., polysilicon layers 103, and a silicon oxynitride film 120b is formed on the element isolation insulating film 106 made of, e.g., a silicon oxide film. As described above, the radical nitride film 120 (120a and 120b) below the interelectrode insulating film 108 changes in accordance with the materials of the floating gate electrodes FG and element isolation insulating film 106 as undercoats.

As in the first embodiment, the interelectrode insulating film 108 is desirably a silicon oxide film, a metal silicate film, a stacked film having a silicon oxide film as the upper layer, or a stacked film having a metal silicate film as an upper layer. In this embodiment, an aluminum silicate film is used as the interelectrode insulating film 108 as an example.

FIGS. 9A and 9B to FIGS. 12A and 12B are sectional views of the manufacturing steps of the nonvolatile semiconductor memory device according to the second embodiment of the present invention. Each figure with a suffix A is a sectional view in the bit line direction (channel length direction), and each figure with a suffix B is a sectional view in the word line direction (channel width direction). A method of manufacturing the nonvolatile semiconductor memory device according to the second embodiment will be explained below.

Figure 9B:
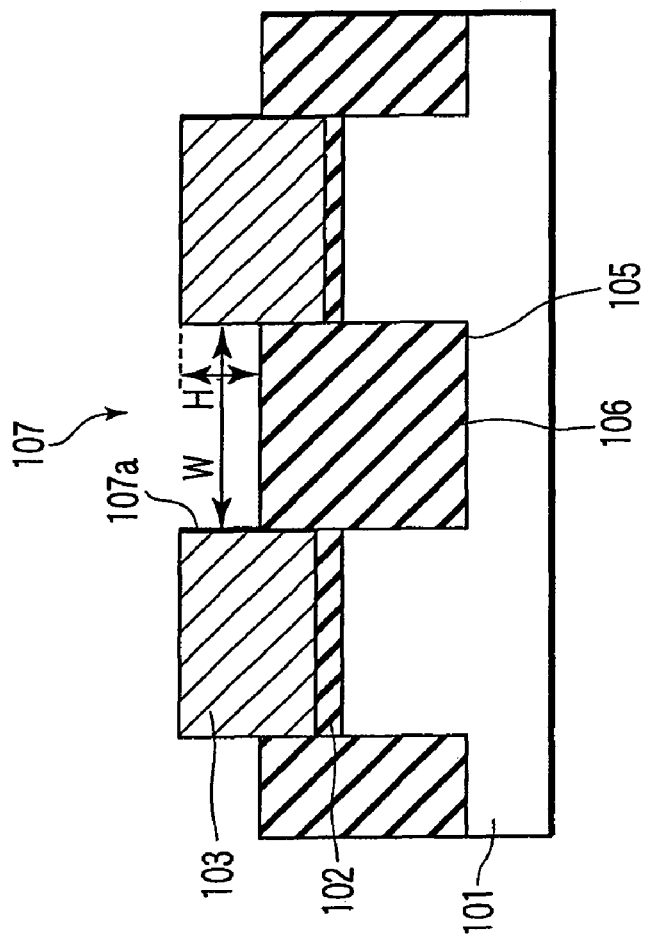
Figure 9A:
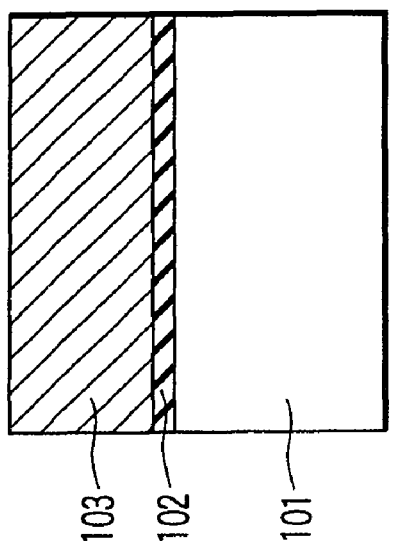

First, as shown in FIGS. 9A and 9B, following the same procedure (FIGS. 2A and 2B to FIGS. 4A and 4B) as in the first embodiment, a trench 107 is formed between polysilicon layers 103 (floating gate electrodes FG) adjacent to each other, and sidewall surfaces 107a of the polysilicon layers 103 are exposed. A height H of the sidewall surfaces 107a is, e.g., 50 nm. Also, an interval (the width of an element isolation insulating film 106) W of the adjacent floating gate electrodes FG is, e.g., 50 nm.

Then, as shown in FIGS. 10A and 10B, a silicon substrate 101 is placed in a radical nitriding chamber (not shown) and heated to 400° C., the pressure is adjusted to 6 Pa while a gas mixture of 40 sccm of nitrogen gas and 1,000 sccm of argon gas is supplied into the chamber, and a microwave having a power of 1 kW is supplied to generate radical nitrogen, thereby performing radical nitriding on the surfaces of the polysilicon layers 103 and element isolation insulating film 106 for 90 sec. As a consequence, a radical nitride film 120 is formed. In this embodiment, a silicon nitride film 120a having a thickness of, e.g., 1 nm is formed on the exposed surfaces of the polysilicon layers 103, and a silicon oxynitride film 120b having a thickness of, e.g., 2 nm is formed on the exposed surface of the element isolation insulating film 106 made of a silicon oxide film.

Then, an interelectrode insulating film 108 is formed on the radical nitride film 120. In this embodiment, a 15 nm-thick aluminum silicate film is deposited as the interelectrode insulating film 108 by, e.g., ALD (Atomic Layer Deposition).

The silicon substrate 101 is placed in the radical nitriding chamber (not shown) again and heated to 400° C., the pressure is adjusted to 6 Pa while a gas mixture of 40 sccm of nitrogen gas and 1,000 sccm of argon gas is supplied into the chamber, and a microwave having a power of 1 kW is supplied to generate radical nitrogen, thereby performing radical nitriding on the surface of the interelectrode insulating film 108 for 90 sec. As a consequence, a radical nitride film 109 is formed on the surface of the interelectrode insulating film 108. The radical nitride film 109 is formed because the nitrogen radicals diffuse in the surface portion of the interelectrode insulating film 108. In this embodiment, a silicon oxynitride film having a thickness of, e.g., 2 nm is formed as the radical nitride film 109.

Radical nitrogen means a nitrogen atom in an excited state, a nitrogen atom in a ground state, and a nitrogen molecule in an excited state, and includes both electrically neutral and charged atoms or molecules. The above effect is obtained when one or more types of the radical nitrogen are contained. Radical nitriding is also a nitriding method which uses one or more types of the radical nitrogen described above as nitriding species. A typical radical nitrogen density is 1E12 cm$^{-3}$ or more. To shorten the process time of the nitriding step by increasing the nitriding efficiency, a radical nitrogen density of 1E15 cm$^{-3}$ or more is desired.

In this embodiment, radical nitriding of the surface of the interelectrode insulating film 108 is performed in the gas mixture ambient containing nitrogen gas and argon gas. However, the radical nitriding method is not limited to this method, and it is also possible to use another nitrogen-containing gas or a gas mixture of another nitrogen-containing gas and a rare gas. However, it is desirable to generate nitrogen radicals by using nitrogen gas alone or a gas mixture of nitrogen gas and a rare gas. This is so because it is possible to well reduce the hydrogen content in the silicon oxynitride film 120b formed on the exposed surface of the element isolation insulating film 106, and avoid faulty operations of the memory device caused by charge transfer between the floating gate electrodes FG adjacent to each other.

Figure 11A:
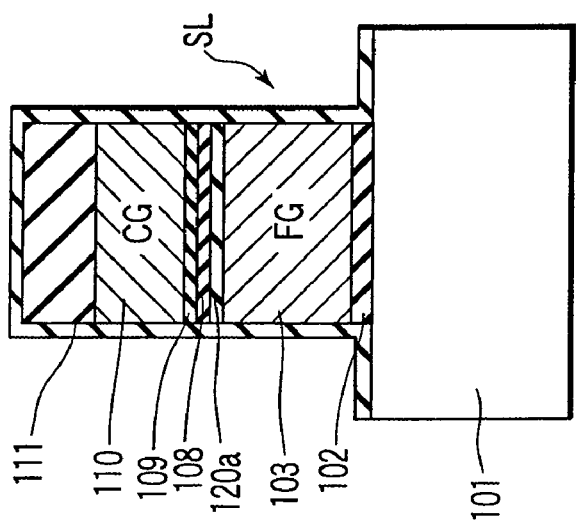
Figure 11B:
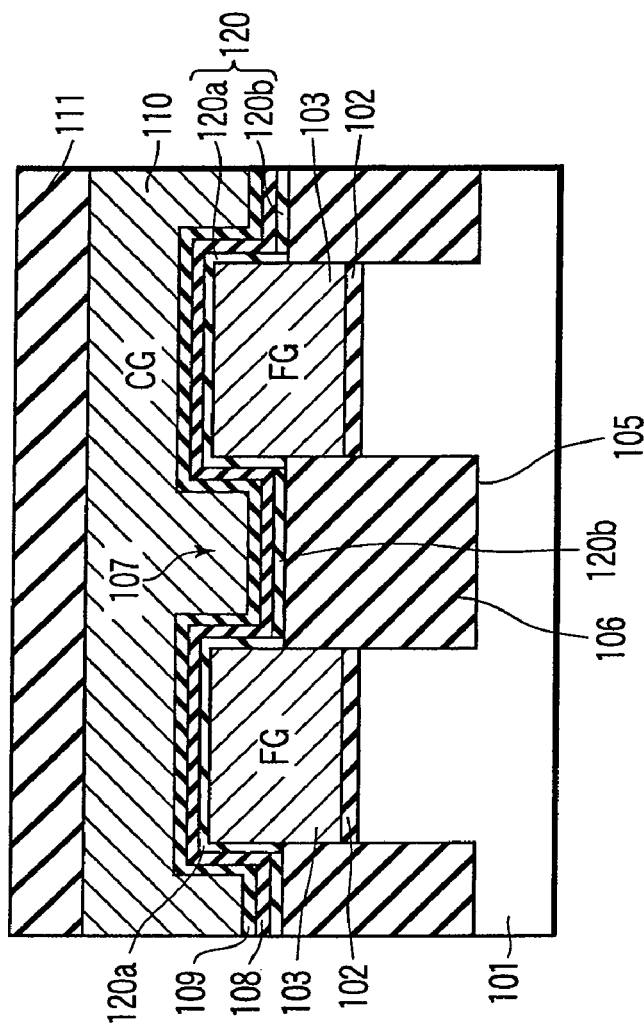

As shown in FIGS. 11A and 11B, a conductive layer 110 having a thickness of, e.g., 100 nm and serving as a control gate electrode CG is deposited on the radical nitride film 109 by CVD. The conductive layer 110 has a two-layered structure including, e.g., a polysilicon layer/tungsten silicide layer. In addition, an RIE mask material 111 is deposited on the conductive layer 110. After that, the mask material 111, conductive layer 110, radical nitride film 109, interelectrode insulating film 108, silicon nitride film 120a, polysilicon layers 103, and tunnel oxide film 102 are sequentially etched by RIE using a resist mask (not shown). By this etching, slits SL are formed in the word line direction. In this manner, floating gate electrodes FG and a control gate electrode CG each having a desired shape are formed.

Figure 12B:
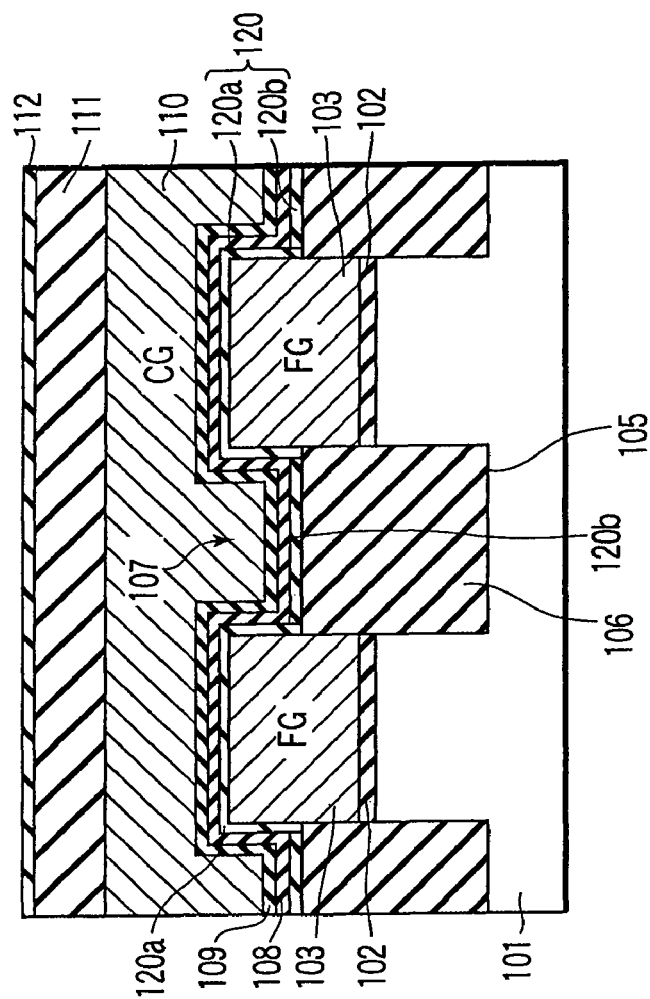
Figure 12A:
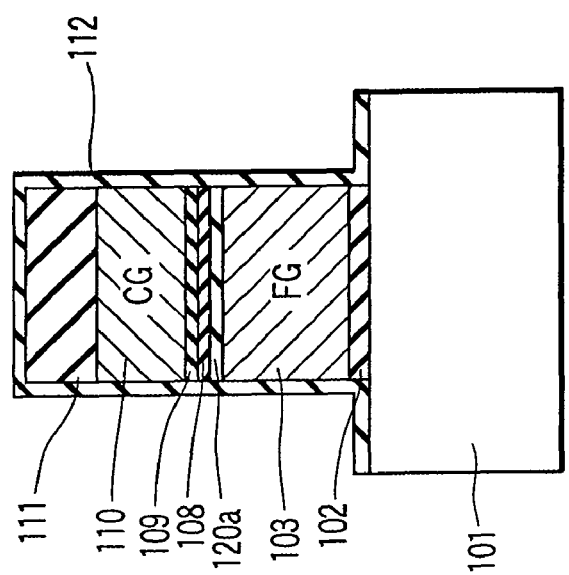

As shown in FIGS. 12A and 12B, thermal oxidation and CVD are combined to form a gate sidewall oxide film 112 made of, e.g., a silicon oxide film on the silicon substrate 101, on the side surfaces of the tunnel oxide film 102, floating gate electrodes FG, silicon nitride film 120a, interelectrode insulating film 108, radical nitride film 109, control gate electrode CG, and mask material 111, and on the mask material 111. In this step, no bird's beak oxidation regions are formed below and above the end portions of the interelectrode insulating film 108.

Then, as shown in FIGS. 8A and 8B, ion implantation is used to form source/drain diffusion layers 114 in the silicon substrate 101. In addition, an interlayer dielectric film 115 is formed on the gate sidewall oxide film 112. After that, a nonvolatile semiconductor memory device is completed by forming interconnecting layers and the like by using the well-known method.

In the second embodiment described above, the same effects as in the first embodiment can be obtained. Additionally, in the second embodiment, the radical nitride film 120 (silicon nitride film 120a) is formed below the interelectrode insulating film 108 between the floating gate electrodes FG and control gate electrode CG by radical nitriding. Since, therefore, the upper surface of the floating gate electrodes FG is protected by the radical nitride film 120 (silicon nitride film 120a) when the gate sidewall oxide film 112 is formed, no bird's beak oxidation region is formed below the interelectrode insulating film 108 even after the oxidation step. Accordingly, it is possible to suppress the formation of bird's beaks much better than in the first embodiment, and effectively prevent the decrease in capacitance of the interelectrode insulating film 108.

Also, radical nitriding improves the quality of the silicon oxynitride film 120b formed on the surface of the element isolation insulating film 106. This makes it possible to further prevent faulty operations of the device caused by charge transfer between the floating gate electrodes FG adjacent to each other.

Furthermore, an increase in total physical film thickness of an interelectrode insulating film 108a between the control gate electrode CG and floating gate electrodes FG is only about 1 nm which is the thickness of the silicon nitride film 120a. Accordingly, the total physical film thickness of the interelectrode insulating film 108a does not greatly increase in this embodiment as well. This makes it possible to avoid malfunctions of the memory device because an increase in parasitic capacitance between adjacent cells, depletion of the control gate electrode CG, and a breakdown voltage drop between the silicon substrate 101 and control gate electrode CG are almost no problem.

Third Embodiment

Figure 13:
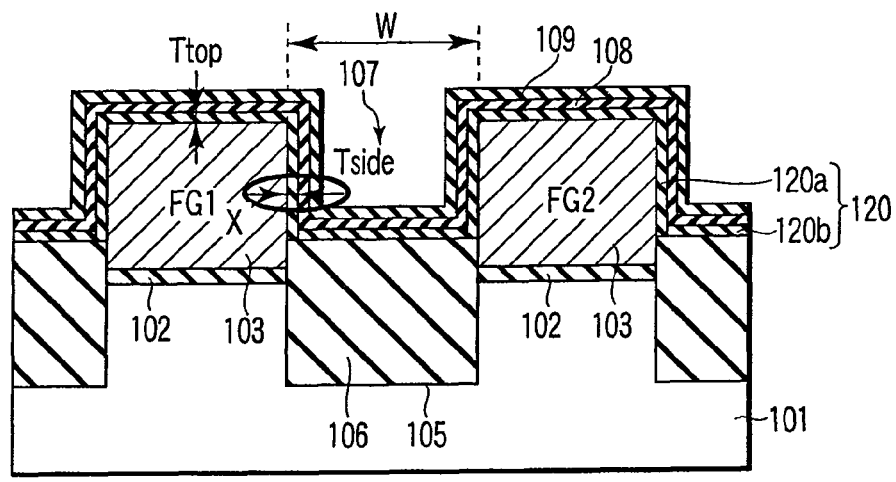
FIG. 13 is a sectional view showing a nonvolatile semiconductor memory device according to a third embodiment of the present invention.

If a structure (to be referred to as an NONON structure hereinafter) having radical nitride films 109 and 120 above and below an interelectrode insulating film 108 made of an ONO film is formed when a trench 107 between adjacent floating gates FG1 and FG2 has a high aspect ratio and a narrow opening, a film thickness Tside of the radical nitride film 120 (120a) on the sidewall surfaces of the trench 107 sometimes decreases in a portion X (a side-surface portion in the lower portion of the trench 107) in the lower portion of the floating gate electrode FG1 (FG2) (FIG. 13). This is presumably because radical nitriding hardly reaches the bottom of the trench 107 to make the supply amount of radical nitriding insufficient. If this is the case, an electric charge leak between the floating gate electrode FG and a control gate electrode CG in the portion X may increase to worsen the charge retention characteristics.

To solve the above problem, a third embodiment uses means (1) and (2) below as examples.

(1) The portion X in FIG. 13 is given an ONONON structure (a structure in which an oxide film is formed as the lowermost layer of the NONON structure) (means examples 1 and 3).

(2) A radical nitride film as the lowermost layer of the NONON structure is formed by radical nitriding at a nitriding pressure of 5 Pa or more (desirably, 10 Pa or more) (means example 2).

Note that the above problem becomes significant when the aspect ratio of the trench 107 is 1 or more and an opening width W is 100 nm or less, and becomes more significant when the aspect ratio of the trench 107 is 2 or more and the opening width W is 50 nm or less.

The details of means examples 1 to 3 will be explained below.

(1) MEANS EXAMPLE 1

Figure 14:
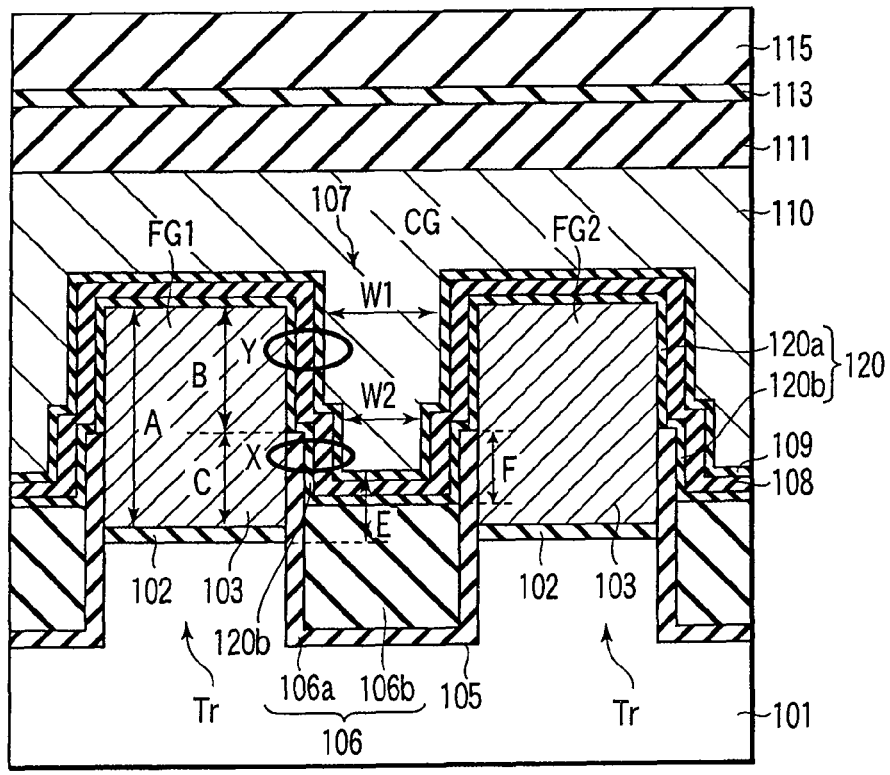
FIG. 14 is a sectional view showing a nonvolatile semiconductor memory device of means example 1 according to the third embodiment of the present invention.

FIG. 14 is a sectional view of a nonvolatile semiconductor memory device of means example 1 according to the third embodiment of the present invention. FIG. 14 is a sectional view in the word line direction (channel width direction). The nonvolatile semiconductor memory device of means example 1 according to the third embodiment will be described below.

As shown in FIG. 14, an element isolation trench 105 is formed in a silicon substrate 101, and an element isolation insulating film 106 is formed in the element isolation trench 105. This separates adjacent floating gate electrodes FG1 and FG2.

Since the floating gate electrodes FG1 and FG2 project upward from the element isolation insulating film 106, a trench 107 is formed on the element isolation insulating film 106 between the adjacent floating gate electrodes FG1 and FG2.

A radical nitride film 120 is formed on the exposed surfaces of the floating gate electrodes FG1 and FG2 and on the exposed surfaces (the side surfaces and bottom surface of the trench 107) of the element isolation insulating film 106. The radical nitride film 120 is formed by performing radical nitriding on the exposed surfaces of the floating gate electrodes FG and element isolation insulating film 106. Therefore, in accordance with the material as an undercoat, a silicon nitride film 120a is formed on the floating gate electrodes FG made of, e.g., polysilicon layers 103, and a silicon oxynitride film 120b is formed on the element isolation insulating film 106 made of, e.g., a silicon oxide film. That is, the radical nitride film 120 (120a and 120b) changes in accordance with the materials of the floating gate electrodes FG and element isolation insulating film 106 as undercoats.

An interelectrode insulating film 108 is formed on the radical nitride film 120, and a radical nitride film 109 is formed on the interelectrode insulating film 108. The radical nitride film 109 is formed by performing radical nitriding on the exposed surface of the interelectrode insulating film 108. A control gate electrode CG is formed on the radical nitride film 109.

The element isolation insulating film 106 is made up of a first element isolation insulating film 106a and second element isolation insulating film 106b. The first element isolation insulating film 106a is formed along the side surfaces and bottom surface of the element isolation trench 105 from the side-surface portions in the lower portions of the floating gate electrodes FG. The second element isolation insulating film 106b is formed on the first element isolation insulating film 106a.

The upper surface of the second element isolation insulating film 106b is positioned below the uppermost surface of the first element isolation insulating film 106a, so the side surfaces in the upper portion of the first element isolation insulating film 106a are exposed. Accordingly, the first element isolation insulating film 106a projects upward from the second element isolation insulating film 106b. In the side-surface portions in the lower portions of the floating gate electrodes FG1 and FG2, therefore, portions of the first element isolation insulating film 106a exist between the floating gate electrodes FG1 and FG2 and the radical nitride film 120 (120b). Hence, in the portion X, i.e., in the side-surface portion in the lower portion of the floating gate electrodes FG1 and FG2 (on the side surface in the lower portion of the trench 107), a stacked structure of the first element isolation insulating film (oxide film) 106a/radical nitride film 120 (120a)/interelectrode insulating film (ONO film) 108/radical nitride film 109, i.e., an ONONON structure, is formed.

The uppermost surface of the first element isolation insulating film 106a is positioned below the upper surfaces of the floating gate electrodes FG1 and FG2, so the side-surface portions in the upper portions of the floating gate electrodes FG1 and FG2 are exposed. Therefore, in the side-surface portions in the upper portions of the floating gate electrodes FG1 and FG2, the first element isolation insulating film 106a does not exist between the floating gate electrodes FG1 and FG2 and the radical nitride film 120 (120a). In other words, the radical nitride film 120 (120a) is in contact with the side-surface portions in the upper portions of the floating gate electrodes FG1 and FG2. Accordingly, in a portion Y, i.e., in the side-surface portion in the upper portion of the floating gate electrodes FG1 and FG2 (on the side surface in the upper portion of the trench 107), a stacked structure of the radical nitride film 120 (120a)/interelectrode insulating film (ONO film) 108/radical nitride film 109, i.e., an NONON structure, is formed.

As described above, on the side surface of the floating gate electrodes FG1 and FG2 (on the side surface of the trench 107), the ONONON structure is formed in the portion X, and the NONON structure is formed in the portion Y, i.e., the portions X and Y have different structures. This is so because it is desirable to form the first element isolation insulating film 106a in the portion X, and not to form the first element isolation insulating film 106a in the portion Y. The reasons are as follows.

First, if the first element isolation insulating film 106a is formed in the portion Y, the electric capacitance of the interelectrode insulating film 108a decreases. To avoid this problem, a height A of the floating gate electrodes FG1 and FG2 must be increased. This increases the difficulty of cell shape processing. In addition, faulty operations occur owing to an increase in parasitic capacitance between the floating gate electrodes FG1 and FG2 adjacent to each other in the direction perpendicular to the paper.

Second, if the first element isolation insulating film 106a is formed in the portion Y, a distance W1 between the adjacent floating gate electrodes FG1 and FG2 shortens. This causes faulty operation by depletion of the control gate electrode CG.

The first element isolation insulating film 106a is desirably an oxide film such as an HTO (High Temperature Oxide) film or silicon oxide film. This is so because an oxide film has a high potential barrier to electric charge, and this increases the effect of suppressing the electric charge leak between the floating gate electrode FG and control gate electrode CG.

Note that the first element isolation insulating film 106a is not limited to an oxide film and may also be another insulating film, e.g., a silicon oxynitride film, silicon nitride film, or high-k insulating film, because even these insulating films have the effect of increasing the distance between the floating gate electrode FG and control gate electrode CG.

To increase the effect of suppressing the electric charge leak between the floating gate electrode FG and control gate electrode CG, however, the material of the first element isolation insulating film 106a desirably has a high potential barrier to electric charge. Also, to avoid faulty operations of the memory caused by interference between adjacent cells when the electric capacitance between the adjacent floating gate electrodes FG1 and FG2 decreases, the material of the first element isolation insulating film 106a desirably has a low dielectric constant. From these viewpoints, the material of the first element isolation insulating film 106a is most desirably a silicon oxide film.

The second element insulating film 106b desirably has an etching rate higher than that of the first element isolation insulating film 106a. For example, the second element isolation insulating film 106a is made of a polysilazane film or HDP (High Density Plasma) oxide film.

The radical nitride film 120 below the interelectrode insulating film 108 has different film thicknesses in the portions X and Y, because radical nitriding is used. Accordingly, the thickness of the radical nitride film 120 (120b) in the ONONON structure in the portion X is smaller than that of the radical nitride film 120 (120a) in the NONON structure in the portion Y.

Likewise, the radical nitride film 109 above the interelectrode insulating film 108 also has different film thicknesses in the portions X and Y, because radical nitriding is used. Accordingly, the thickness of the radical nitride film 109 in the ONONON structure in the portion X is smaller than that of the radical nitride film 109 in the NONON structure in the portion Y.

Referring to FIG. 14, it is desirable to optimize the height A of the floating gate electrodes FG1 and FG2, a distance B from the upper surfaces of the floating gate electrodes FG1 and FG2 to the upper surface of the first element isolation insulating film 106a, a distance C from the bottom surfaces of the floating gate electrodes FG1 and FG2 to the upper surface of the first element isolation insulating film 106a, and a distance F from the upper surface of the second element isolation insulating film 106b to the upper surface of the first element isolation insulating film 106a, on the basis of the tradeoff relationship between "the suppression of the electric charge leak between the floating gate electrode FG and control gate electrode CG" and "the avoidance of the decrease in electric capacitance of the interelectrode insulating film 108a".

Referring to FIG. 14, it is important to ensure a distance E between the silicon substrate 101 and control gate electrode CG. This is so because high electric fields are applied to these two components, so dielectric breakdown may occur. Accordingly, the distance E between the silicon substrate 101 and control gate electrode CG is desirably a distance at which no dielectric breakdown occurs between the silicon substrate 101 and control gate electrode CG.

Figure 17:
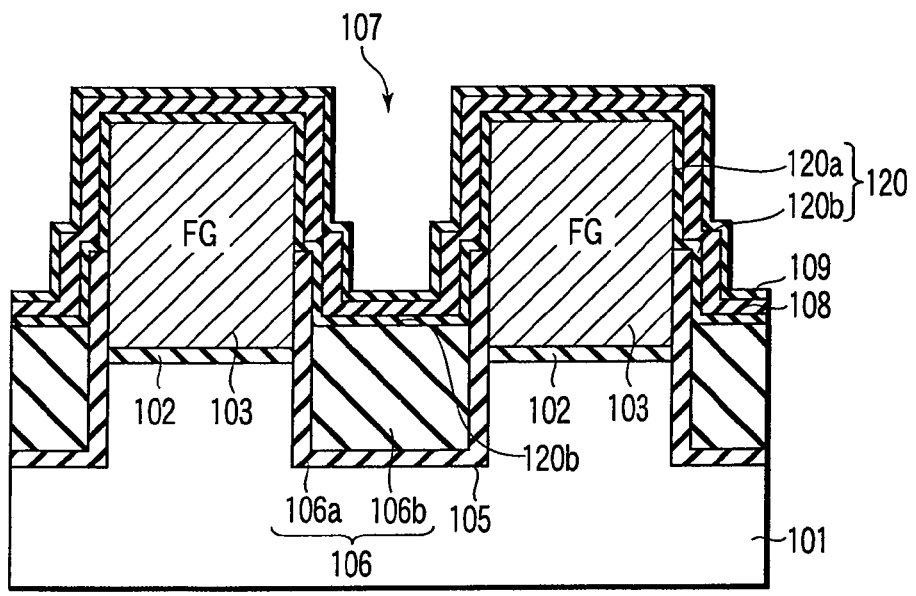

FIGS. 15 to 17 are sectional views showing the manufacturing steps of the nonvolatile semiconductor memory device of means example 1 according to the third embodiment of the present invention. Each figure is a sectional view in the word line direction (channel width direction). A method of manufacturing the nonvolatile semiconductor memory device of means example 1 according to the third embodiment will be explained below.

First, an element isolation trench 105 is formed in a silicon substrate 101 in the same manner as in the first embodiment (FIGS. 2A and 2B).

Then, as shown in FIG. 15, an element isolation insulating film 106 is deposited on the exposed surfaces in the element isolation trench 105 and on a mask material 104, and the element isolation trench 105 is completely filled with the element isolation insulating film 106. The element isolation insulating film 106 is made up of a first element isolation insulating film 106a and second element isolation insulating film 106b. The first element isolation insulating film 106a has a low etching rate, and is made of an HTO film or the like. The second element isolation insulating film 106b is formed on the first element isolation insulating film 106a, has an etching rate higher than that of the first element isolation insulating film 106a, and is made of a polysilazane film, HDP oxide film, or the like. After that, the upper surface of the element isolation insulating film 106 is planarized by CMP until the mask material 104 is exposed.

As shown in FIG. 16, the mask material 104 is selectively etched away by hot phosphoric acid. Then, the element isolation insulating film 106 is partially etched by using a dilute hydrofluoric acid solution. Since the first and second element isolation insulating films 106a and 106b have an etching rate difference, the upper surface of the first element isolation insulating film 106a becomes lower than the upper surfaces of polysilicon layers 103, so sidewall surfaces 107a of the polysilicon layers 103 are exposed. In addition, the upper surface of the second element isolation insulating film 106b becomes lower than the upper surface of the first element isolation insulating film 106a, so sidewall surfaces 107b of the first element isolation insulating film 106a are exposed. Consequently, a trench 107 having a step is formed between the polysilicon layers 103 (floating gate electrodes FG) adjacent to each other.

As shown in FIG. 17, the silicon substrate 101 is placed in a radical nitriding chamber (not shown) and heated to 400° C., the pressure is adjusted to 6 Pa while 40 sccm of nitrogen gas and 1,000 sccm of argon gas are supplied into the chamber, and microwaves having a power of 1 kW are supplied to generate radical nitrogen, thereby performing radical nitriding on the surfaces of the polysilicon layers 103 and element isolation insulating film 106 for 90 sec. Consequently, a silicon nitride film 120a is formed on the exposed surfaces of the polysilicon layers 103, and a silicon oxynitride film 120b is formed on the exposed surface of the element isolation insulating film 106.

Then, an interelectrode insulating film 108 is formed on the silicon nitride film 120a and silicon oxynitride film 120b. In this embodiment, an ONO film having a thickness of, e.g., 15 nm is formed as the interelectrode insulating film 108 by CVD. After that, a radical nitride film 109 is formed by radical nitriding in the same manner as in the first embodiment.

As shown in FIG. 14, a conductive layer 110 and mask material 111 are sequentially deposited on the radical nitride film 109 and etched. As a consequence, floating gate electrodes FG and a control gate electrode CG each having a desired shape are formed. A gate sidewall oxide film 112 is then formed by thermal oxidation. This thermal oxidation forms no bird's beak oxidation region below and above the end portions of the interelectrode insulating film 108. In addition, source/drain diffusion layers 114 and an interlayer dielectric film 115 are formed. After that, a nonvolatile semiconductor memory device is completed by forming interconnecting layers and the like by the well-known method.

In means example 1 of the third embodiment described above, even when the trench 107 has a high aspect ratio and a narrow opening, the first element isolation insulating film 106a exists in the portion X in the lower portion of the floating gate electrode FG1 (FG2). Since this increases the total film thickness of the insulating films (the first element isolation insulating film 106a, radical nitride film 120, interelectrode insulating film 108, and radical nitride film 109) in the portion X, the distance between the floating gate electrode FG and control gate electrode CG can be increased. This makes it possible to suppress the electric charge leak between the floating gate electrode FG and control gate electrode CG, and ensure the charge retention characteristics.

Also, when the first element isolation insulating film 106a is formed by an oxide film which is a material having a high potential barrier to electric charge, it is possible to further suppress the electric charge leak between the floating gate electrode FG and control gate electrode CG, and ensure the charge retention characteristics.

(2) MEANS EXAMPLE 2

Figure 18:
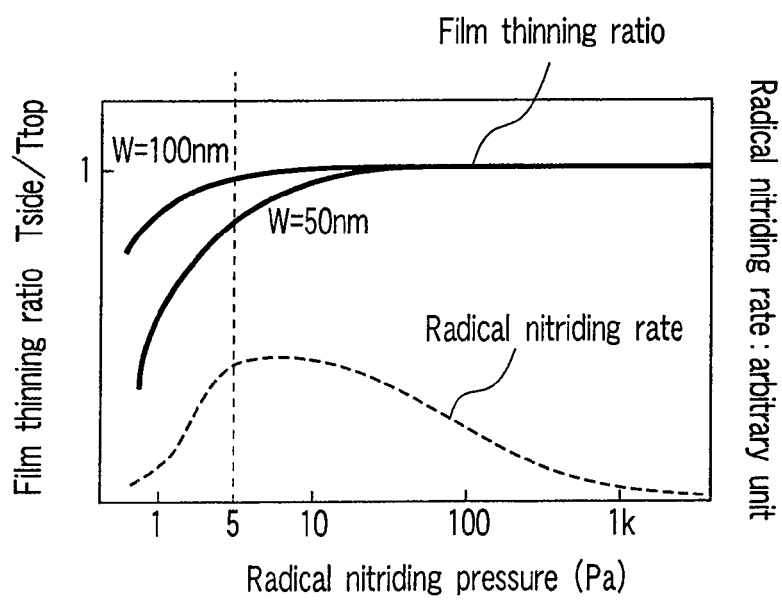
FIG. 18 is a graph showing the film thinning ratio and radical nitriding rate as functions of the radical nitriding pressure according to means example 2 of the third embodiment of the present invention.

FIG. 18 shows the film thinning ratio and radical nitriding rate as functions of the radical nitriding pressure according to means example 2 of the third embodiment of the present invention. Letting Ttop be the film thickness of the radical nitride film 120 (120a) on the upper surfaces of the floating gate electrodes FG1 and FG2 and Tside be the film thickness of the radical nitride film 120 (120a) on the side surfaces of the floating gate electrodes FG1 and FG2, a film thinning ratio Tside/Ttop shown in FIG. 18 indicates the film thinning ratio of the radical nitride film 120 near the bottom of the trench 107. The film thickness Tside of the radical nitride film 120 (120a) is a film thickness in a position 50 nm below the upper surfaces of the floating gate electrodes FG1 and FG2.

As shown in FIG. 18, the radical nitriding rate at high pressures decreases as the electron temperature lowers. On the other hand, the radical nitriding rate at low pressures increases as the electron temperature rises. In a pressure region (a region of less than 5 Pa) in which the radical density decreases, the mean free path of radical nitrogen as a nitriding agent prolongs, and the amount of radical nitrogen supplied to the side walls near the bottom of the trench 107 having a high aspect ratio and a narrow opening reduces. As a consequence, thinning of the radical nitride film 120 occurs. This thinning can be avoided if the radical nitride film 120 is formed at a pressure higher than the pressure (5 Pa) at which the radical nitriding rate peaks.

From the foregoing, radical nitriding for forming the radical nitride film 120 as the lowermost layer of the NONON structure is desirably performed at a nitriding pressure of 5 Pa or more (preferably, 10 Pa or more). Also, the upper limit of the nitriding pressure is preferably 1 kPa or less (more preferably, 100 Pa or less), in order to ensure the film formation rate of radical nitriding (avoid an increase in process time of the nitriding step).

In radical nitriding for forming the radical nitride film 109 as the uppermost layer of the NONON film, the radical nitriding pressure is preferably selected as follows in accordance with which of "the prevention of bird's beak formation" or "the prevention of depletion of the control gate electrode CG" is regarded as important.

When the prevention of bird's beak formation is regarded as important, radical nitriding for forming the radical nitride film 109 is preferably performed at a nitriding pressure of 5 Pa or more (desirably, 10 Pa or more). In this case, it is possible to suppress thinning of the radical nitride film 109 near the bottom of the trench 107 on the side walls of the floating gate electrodes FG1 and FG2. This makes it possible to prevent bird's beak formation in the interface between the control gate electrode CG and interelectrode insulating film 108 during gate sidewall oxidation. As a consequence, a decrease in electric capacitance of the interelectrode insulating film 108 can be prevented. Note that in this case, the upper limit of the nitriding pressure is preferably 1 kPa or less (more preferably, 100 Pa or less).

When the prevention of depletion of the control gate electrode CG is regarded as important, radical nitriding for forming the radical nitride film 109 is preferably performed at a nitriding pressure of less than 5 Pa. Since a thin radical nitride film 109 can be formed, it is possible to suppress a decrease in distance W between the floating gate electrodes FG1 and FG2 adjacent to each other. This makes it possible to prevent depletion of the control gate electrode CG.

Note that the above-mentioned critical pressure was 5 Pa when radical nitriding was performed at Ar/$N_2$ flow rates of 1,000 sccm/40 sccm and a microwave power of 1,000 W.

In means example 2 of the third embodiment described above, the radical nitriding pressure is set at 5 Pa or more (desirably, 10 Pa or more) when the radical nitride film 120 is to be formed in the trench 107 having a distance W of, e.g., 100 nm or less between the floating gate electrodes FG1 and FG2 adjacent to each other. In this manner, thinning of the radical nitride film 120 near the bottom of the trench 107 can be avoided. Therefore, it is possible to suppress the electric charge leak between the control gate electrode CG and floating gate electrode FG, and ensure the charge retention characteristics.

(3) MEANS EXAMPLE 3

Means example 3 of the third embodiment is a modification to means example 1 of the third embodiment. The descriptions of the same contents as those of means example 1 are omitted.

Figure 19:
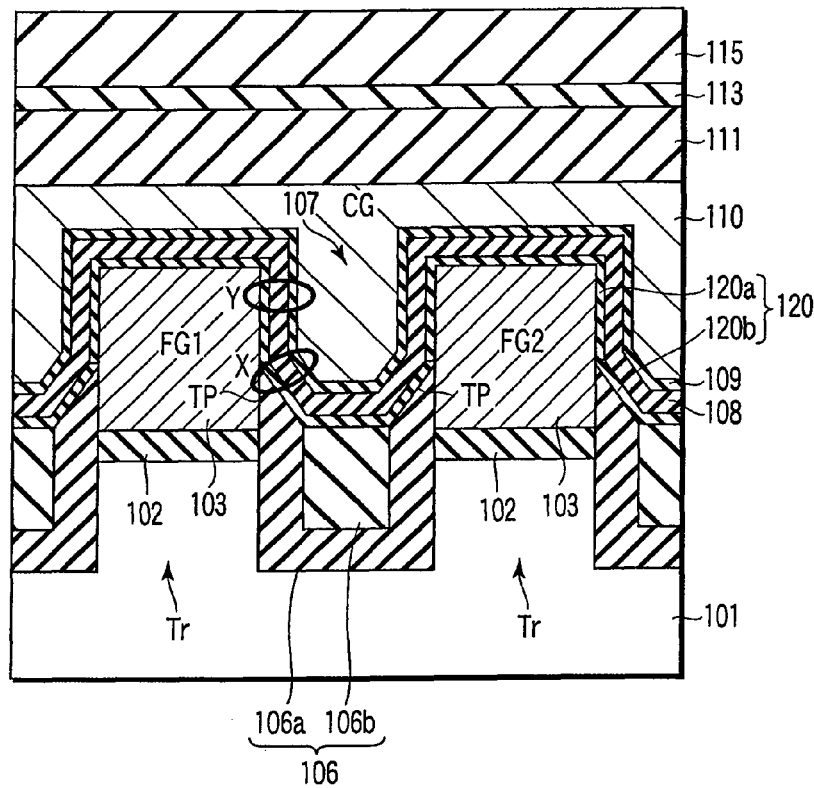
FIG. 19 is a sectional view showing a nonvolatile semiconductor memory device of means example 3 according to the third embodiment of the present invention.
Figure 20:
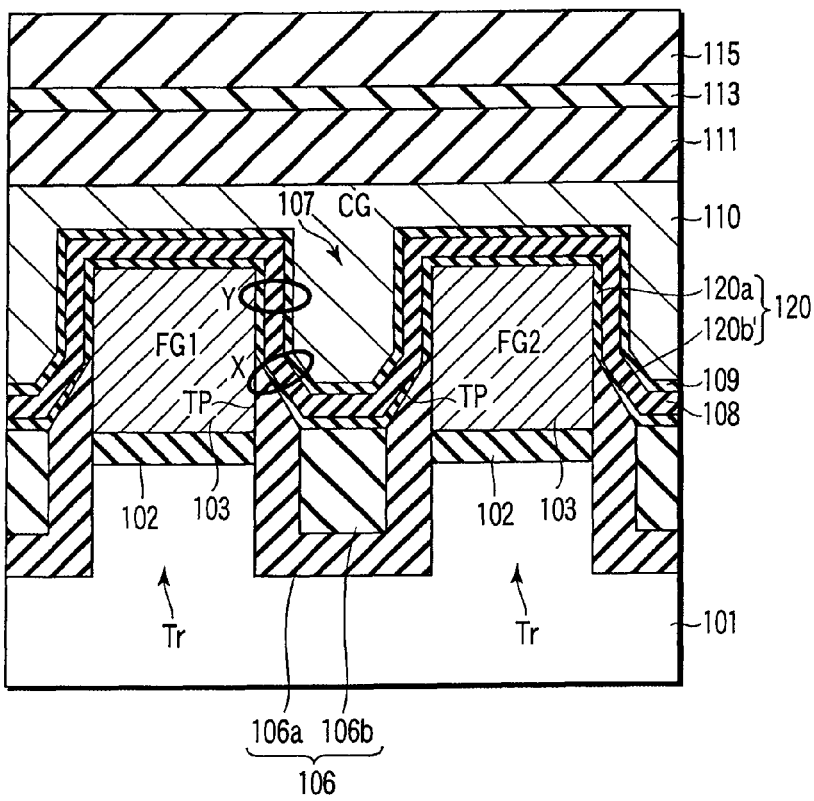
FIG. 20 is a sectional view showing another nonvolatile semiconductor memory device of means example 3 according to the third embodiment of the present invention.

FIG. 19 is a sectional view showing a nonvolatile semiconductor memory device of means example 3 according to the third embodiment of the present invention. FIG. 20 is a sectional view showing another nonvolatile semiconductor memory device of means example 3 according to the third embodiment of the present invention. The sectional view of each of FIGS. 19 and 20 is taken in a word line direction (channel width direction). The nonvolatile semiconductor memory device of means example 3 according to the third embodiment of the present invention will be described below.

As shown in FIG. 19, means example 3 differs from means example 1 in that portion X, or the first element isolation insulating film 106a, which is located on a lower side portion of each of the floating gate electrodes FG1 and FG2 (each lower side portion of the trench 107), is tapered.

In other words, the first element isolation insulating film 106a is gradually thickened downwardly on the lower side portions of the floating gate electrodes FG1 and FG2. A tapered portion TP is therefore formed in the first element isolation insulating film 106a between each of the floating gate electrodes FG1 and FG2 and the radical nitride film 120 (120b).

The radical nitride film 120 formed on the undersurface of the interelectrode insulating film 108 may vary in thickness between X and Y portions. For example, as shown in FIG. 20, the radical nitride film 120 (120b') on the first element isolation insulating film 106a can be formed thinner than the radical nitride film 120 (120a) on the floating gate electrodes FG1 and FG2. This is because a state for giving higher priority to nitriding of silicon than a silicon oxide film is brought about by controlling the energy of radical and plasma nitride. Furthermore, the radical nitride film 120 (120b') on the first element isolation insulating film 106a can be eliminated in substance.

Figure 21:
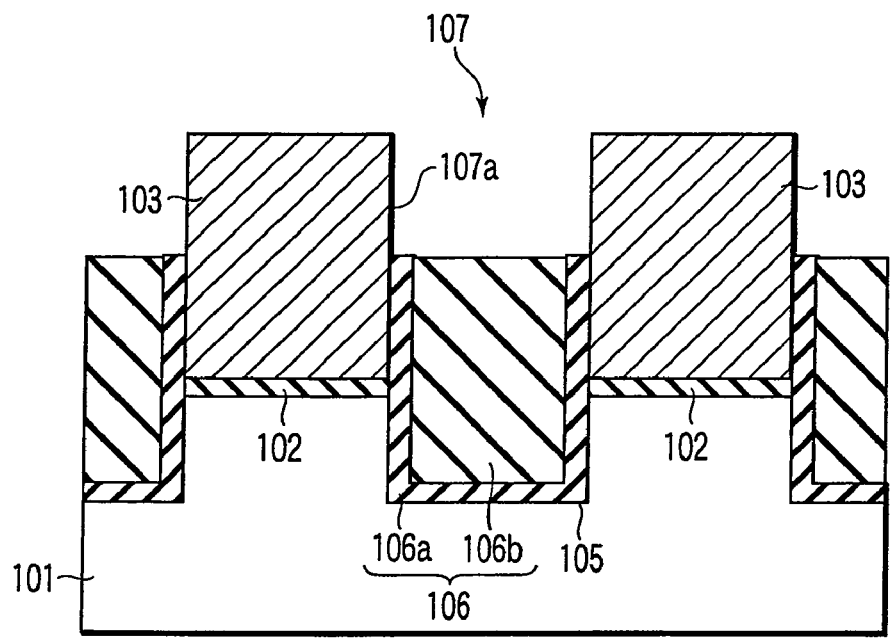
FIGS. 21 and 22 are sectional views showing process of manufacturing the nonvolatile semiconductor memory device of means example 3 according to the third embodiment of the present invention.
Figure 22:
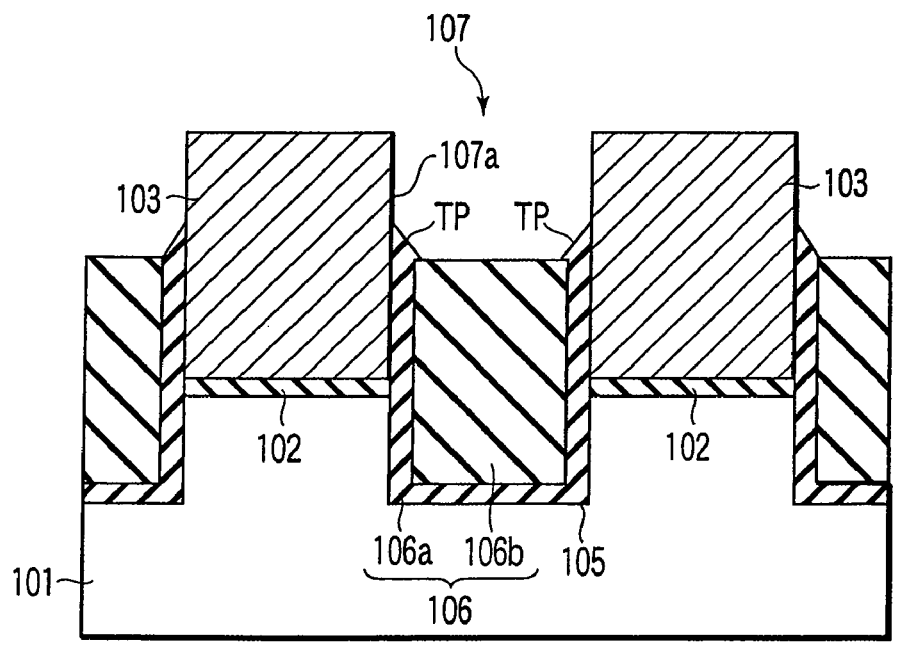
Figure 23:
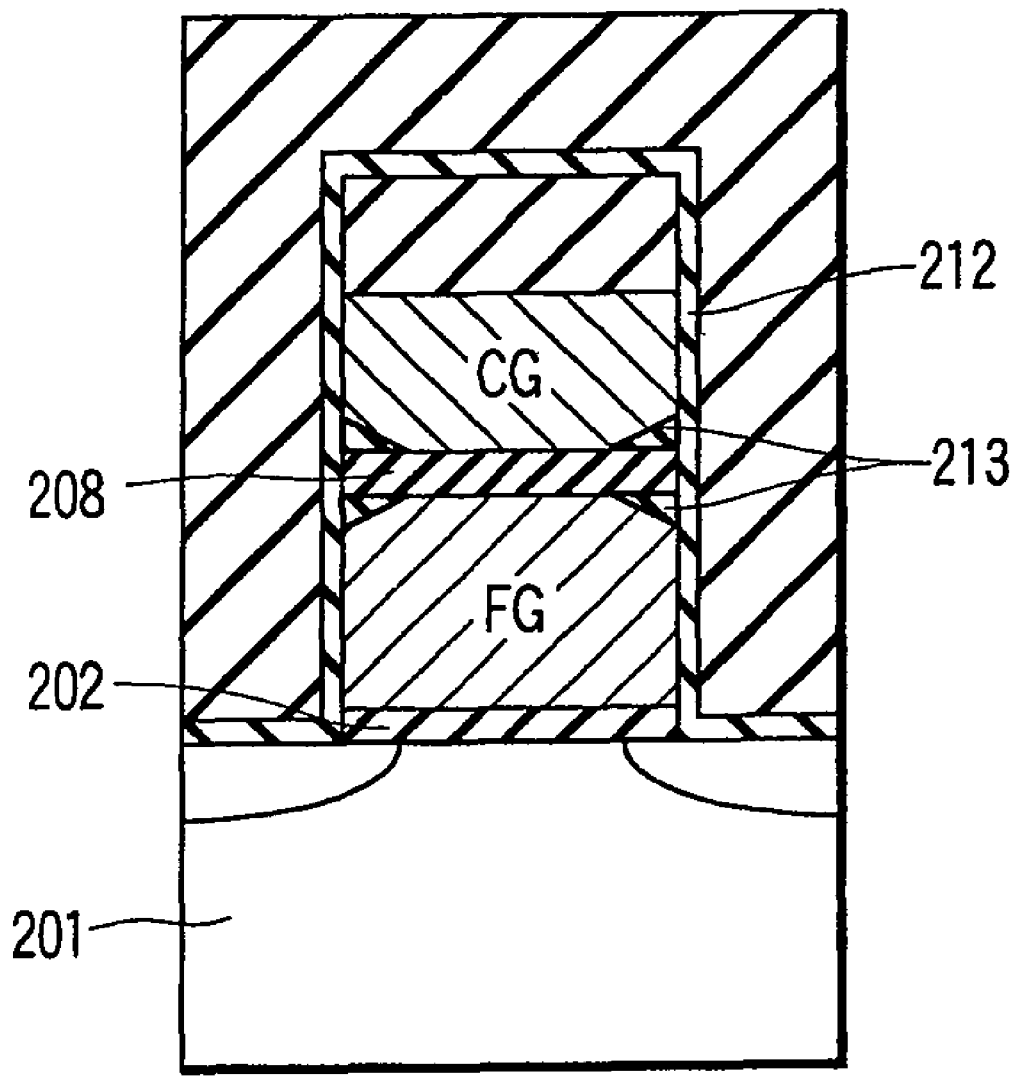
FIG. 23 is a sectional view showing a nonvolatile semiconductor memory device according to prior art.
Figure 24B:
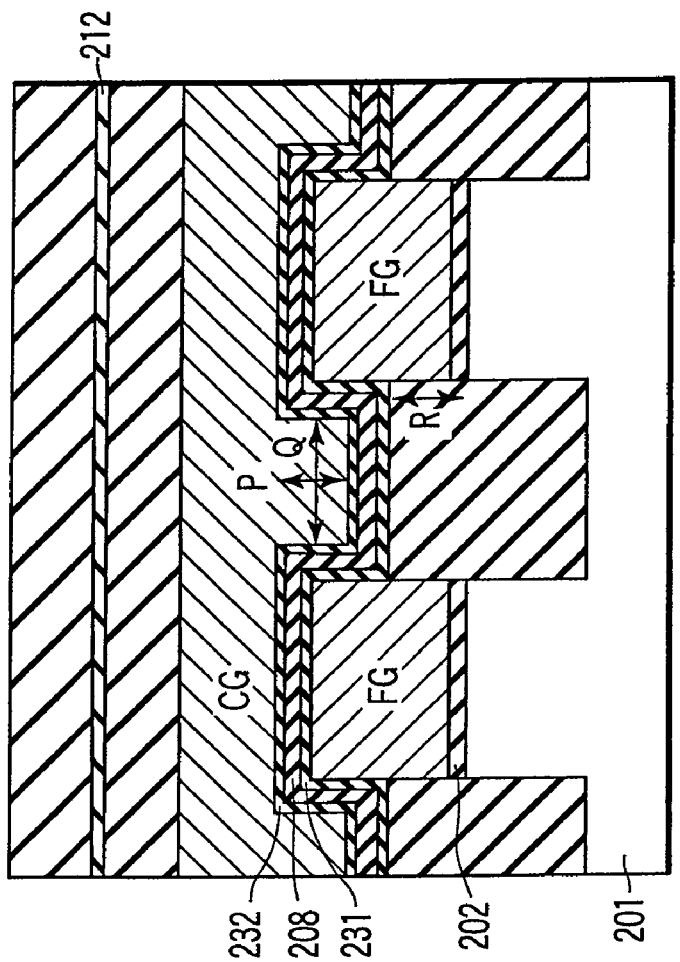
FIGS. 24A and 24B are sectional views in the bit line direction and word line direction, respectively, showing another nonvolatile semiconductor memory device according to prior art.
Figure 24A:
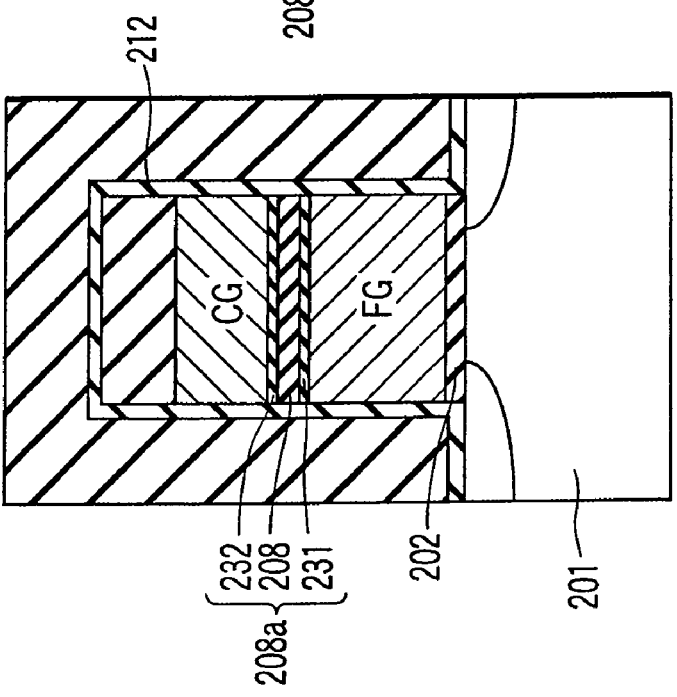

FIGS. 21 and 22 are sectional views showing a process of manufacturing the nonvolatile semiconductor memory device of means example 3 according to the third embodiment of the present invention. Each of the sectional views is taken in the word line direction (channel width direction). A method of manufacturing the nonvolatile semiconductor memory device of means example 3 according to the third embodiment will be described below.

As in means example 1 shown in FIG. 15, first, an element isolation insulating film 106 is formed in an element isolation trench 105. The element isolation insulating film 106 includes a first element isolation insulating film 106a and a second element isolation insulating film 106b. The first element isolation insulating film 106a is made of, e.g., an HTO film and its etching rate is low. The second element isolation insulating film 106b is made of, e.g., a polysilazane film and an HDP oxide film and its etching rate is higher than that of the film 106a.

Referring to FIG. 21, a mask material 104 is selectively etched away by hot phosphoric acid. Then, the element isolation insulating film 106 is partly etched using a dilute hydrofluoric acid solution to expose the sidewall surface 107a of a polysilicon layer 103. An etchant with a small difference in etching rate between the first and second element isolation insulating films 106a and 106b is applied to etching of the element isolation insulating film 106. For example, buffered hydrofluoric acid whose concentration is low can be used as the etchant. Thus, a trench 107 having few steps can be formed.

Referring then to FIG. 22, the first and second element isolation insulating films 106a and 106b are partly removed using a chemical solution (e.g., dilute hydrofluoric acid solution) having a wide difference in etching rate between the first and second element isolation insulating films 106a and 106b. Thus, tapered portion TP is formed in each of the upper portions of the first isolation insulating film 106a. In a nonvolatile semiconductor memory device whose gate width is 70 nm or less, the shape similar to that of the device shown in FIG. 22 can be obtained even though dry etching is applied to the manufacturing step shown in FIG. 21. Since the process subsequent to that is the same as that in means example 1, its descriptions are omitted.

In means example 3, the tapered portion TP formed in each of the upper portions of the first isolation insulating film 106a permits an interelectrode insulating film 108 and a control gate electrode CG to be filled without void. Moreover, the tapered portion TP can inhibit electrons from being injected into the interelectrode insulating film 108 due to the electric field concentrated at the lower corners of the control gate electrode. In means example 3, the loss of electric capacitance is smaller than that in means example 1 and thus leakage current can be decreased.

In the structure of the device shown in FIG. 20, the radical nitride film 120 (120b') is thinned or eliminated on the first element isolation insulating film 106a. Thus, the capacitance between elements can be decreased further and so can be the leakage current therebetween.

Note that this embodiment is explained by taking the NONON structure as an example, but the present invention is not limited to the NONON structure. That is, the present invention is applicable to any structure in which the lowermost and uppermost layers of the interelectrode insulating film 108 are formed by radical nitriding.

It is, of course, also possible to combine means examples 1 and 2 of this embodiment and means examples 2 and 3 thereof.

Furthermore, the present invention is not limited to the above embodiments, and, when practiced, can be variously modified as follows without departing from the spirit and scope of the invention.

(1) In the manufacturing method of each embodiment, the element isolation insulating film 106 is formed after the tunnel oxide film 102 is formed. However, it is also possible to form the tunnel oxide film 102 after the element isolation insulating film 106 is formed.

(2) A radical nitride film may also be formed only between the interelectrode insulating film 108 and floating gate electrode FG, without forming any radical nitride film between the interelectrode insulating film 108 and control gate electrode CG.

(3) The material of the radical nitride film in each embodiment is different from that of a nitride film formed by CVD or thermal nitriding. For example, the radical nitride film contains almost no impurity such as hydrogen or chlorine. This characteristic of the radical nitride film can be analyzed by various methods such as SIMS (Secondary Ion Mass Spectroscopy) or XPS (X-ray Photoelectron Spectroscopy).

(4) In each embodiment, a nitrogen-containing film is formed at least above or below the interelectrode insulating film 108. This nitrogen-containing film can be either a nitrogen-containing film or nitrogen-containing conductive film. Therefore, although the radical nitride film as a nitrogen-containing insulating film is taken as an example of the nitrogen-containing film in each embodiment, a nitrogen-containing conductive film such as a titanium nitride film may also be used. Even when this nitrogen-containing conductive film is used, it is possible to suppress the formation of bird's beaks to the interelectrode insulating film 108, while an increase in physical film thickness of the interelectrode insulating film 108 is prevented.

(5) A semiconductor substrate is used in each embodiment, but the substrate is not limited to a semiconductor substrate. For example, it is also possible to use an SOI (Silicon On Insulator) substrate having a semiconductor substrate, a semiconductor layer, and a buried insulating film formed between the semiconductor substrate and semiconductor layer.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A semiconductor memory device manufacturing method comprising:
    forming a tunnel insulating film on a semiconductor substrate;
    forming a floating gate electrode on the tunnel insulating film;
    forming an element isolation trench by etching the floating gate electrode, tunnel insulating film, and semiconductor substrate;
    forming a first element isolation insulating film on an exposed surface in the element isolation trench;
    forming a second element isolation insulating film on the first element isolation insulating film;
    selectively removing the first and second element isolation insulating films to expose a first side-surface portion in an upper portion of the floating gate electrode and a side-surface portion in an upper portion of the first element isolation insulating film;
    forming a first radical nitride film on surfaces of the floating gate electrode and first and second element isolation insulating films by first radical nitriding;
    forming an interelectrode insulating film on the first radical nitride film;
    forming a second radical nitride film on a surface of interelectrode insulating film by second radical nitriding; and
    forming a control gate electrode on the second radical nitride film,
    wherein in a second side surface portion in a lower portion of the floating gate electrode, a portion of the first element isolation insulating film exists between the floating gate electrode and the first radical nitride film.

2. The method according to claim 1, wherein
    in the second side surface portion in the lower portion of the floating gate electrode, the first element isolation insulating film exists between the floating gate electrode and second radical nitride film, and
    in the first side surface portion of the floating gate electrode, the first element isolation insulating film does not exist between the floating gate electrode and second radical nitride film.

3. The method according to claim 1, wherein a film thickness of the second radical nitride film in a second side-surface portion in a lower portion of the floating gate electrode is smaller than a film thickness of the second radical nitride film in the first side-surface portion of the floating gate electrode.

4. The method according to claim 1, wherein the first element isolation insulating film is an oxide film.

5. The method according to claim 1, wherein a second etching rate of the second element isolation insulating film is higher than a first etching rate of the first element isolation insulating film.

6. The method according to claim 1, wherein the interelectrode insulating film is one of a silicon oxide film, a metal silicate film, a multilayered film having a silicon oxide film as an upper layer, and a multilayered film having a metal silicate film as an upper layer.

* * * * *